US 9,553,604 B2

(12) United States Patent
Inoue

(10) Patent No.: US 9,553,604 B2
(45) Date of Patent: Jan. 24, 2017

(54) INFORMATION PROCESSING SYSTEM, INFORMATION COMPRESSION DEVICE, INFORMATION DECOMPRESSION DEVICE, INFORMATION PROCESSING METHOD, AND PROGRAM

(75) Inventor: Hiroaki Inoue, Tokyo (JP)

(73) Assignee: NEC CORPORATION, Tokyo (JP)

( * ) Notice: Subject to any disclaimer, the term of this patent is extended or adjusted under 35 U.S.C. 154(b) by 188 days.

(21) Appl. No.: 13/262,181

(22) PCT Filed: Mar. 19, 2010

(86) PCT No.: PCT/JP2010/054775
§ 371 (c)(1),
(2), (4) Date: Sep. 29, 2011

(87) PCT Pub. No.: WO2011/113674
PCT Pub. Date: Oct. 7, 2010

(65) Prior Publication Data
US 2012/0030377 A1 Feb. 2, 2012

(30) Foreign Application Priority Data
Mar. 30, 2009 (JP) .................................. 2009-083597

(51) Int. Cl.
*H03M 7/30* (2006.01)
*G11C 7/10* (2006.01)
(Continued)

(52) U.S. Cl.
CPC .............. *H03M 7/30* (2013.01); *G11C 7/103* (2013.01); *G11C 29/003* (2013.01); *H04L 29/12311* (2013.01)

(58) Field of Classification Search
CPC ... H03M 7/30; H04L 29/12311; G11C 29/003; G11C 7/103; G11C 11/16
(Continued)

(56) References Cited

U.S. PATENT DOCUMENTS 6,167,499 A * 12/2000 Letham .................. G11C 7/103
341/76
6,169,241 B1 * 1/2001 Shimizu .................. G10H 7/04
84/604
(Continued)

FOREIGN PATENT DOCUMENTS

JP 11-017971 1/1999
JP 2000-201081 7/2000
(Continued)

OTHER PUBLICATIONS

Alaa R. Alameldeen, David A. Wood, Frequent Pattern Compression: A Significance-Based Compression Scheme for L2 Caches, Technical Report 1500, Computer Science Dept., UW-Madison, Apr. 2004, p. 1-14.
(Continued)

*Primary Examiner* — Barbara Burgess
(74) *Attorney, Agent, or Firm* — Young & Thompson

(57) ABSTRACT

In order to improve the compression rate for configuration information including address information and data information when transmitting or storing configuration information which includes addresses and data having differing characteristics, an information compression device is provided with a compressor which receives as input and compresses the configuration information provided with the addresses and data, and a compressed information storage module for storing the configuration information which is compressed, that is, compressed configuration information, as the information to be decompressed for the user, said compressor including an information separating module for separating the configuration information into address information and data information, an address compressor and data compressor which separately compress the separated address information and data information, and a compressed information outputting module for combining the com-
(Continued)

pressed address information and data information and outputting the result as compressed configuration information.

13 Claims, 18 Drawing Sheets

(51) Int. Cl.
*H04L 29/12* (2006.01)
*G11C 29/00* (2006.01)

(58) Field of Classification Search
USPC .................................................. 709/246, 247
See application file for complete search history.

(56) References Cited

U.S. PATENT DOCUMENTS

| | | | | |
|---|---|---|---|---|
| 6,647,001 | B1* | 11/2003 | Bhagavath | ........ H04L 29/12311 370/331 |
| 7,127,608 | B2* | 10/2006 | Royer | ..................... G06F 21/41 709/225 |
| 7,236,633 | B1* | 6/2007 | Lewis | ..................... H03M 7/30 382/233 |
| 2002/0012525 | A1* | 1/2002 | Yuen | ..................... G11B 27/029 386/241 |
| 2005/0018476 | A1* | 1/2005 | Kamijima | ............... G11C 11/16 365/158 |
| 2005/0268177 | A1 | 12/2005 | John | |
| 2007/0016826 | A1* | 1/2007 | Dubey | ................. G11C 29/003 714/30 |
| 2012/0030377 | A1* | 2/2012 | Inoue | ..................... H03M 7/30 709/247 |

FOREIGN PATENT DOCUMENTS

| | | |
|---|---|---|
| JP | 2005-322209 | 11/2005 |
| JP | 2007-067869 | 3/2007 |
| JP | 2007-234048 | 9/2007 |
| JP | 2007-537547 | 12/2007 |

OTHER PUBLICATIONS

T.A. Welch, A Technique for High-Performance Data Compression, IEEE Computer, pp. 8-19 (1986).

M. Kjelso, M. Gooch, S. Jones, Design and Performance of a Main Memory Hardware Data Compressor, IEEE Proceedings of EUROMICRO-22, pp. 423-430 (Sep. 1996).

* cited by examiner

| 0 | 4-bit WITH NO CODE EXTENSION |
| --- | --- |
| 10 | 8-bit WITH NO CODE EXTENSION |
| 110 | 16-bit WITH NO CODE EXTENSION |
| 111 | 32-bit WITH NO CODE EXTENSION |

| 0 | ALL ZEROS |
| --- | --- |
| 1110 | 4-bit WITH NO CODE EXTENSION |
| 1111 | $0x0\alpha 0\beta$ |
| 110 | $0x\alpha 0\beta 0$ |
| 10110 | 8-bit WITH NO CODE EXTENSION |
| 10111 | 8-bit WITH ZERO PADDING |
| 1010 | SAME HIGHER-ORDER AND LOWER-ORDER BYTES |
| 100 | 16-bit WITH NO CODE EXTENSION |

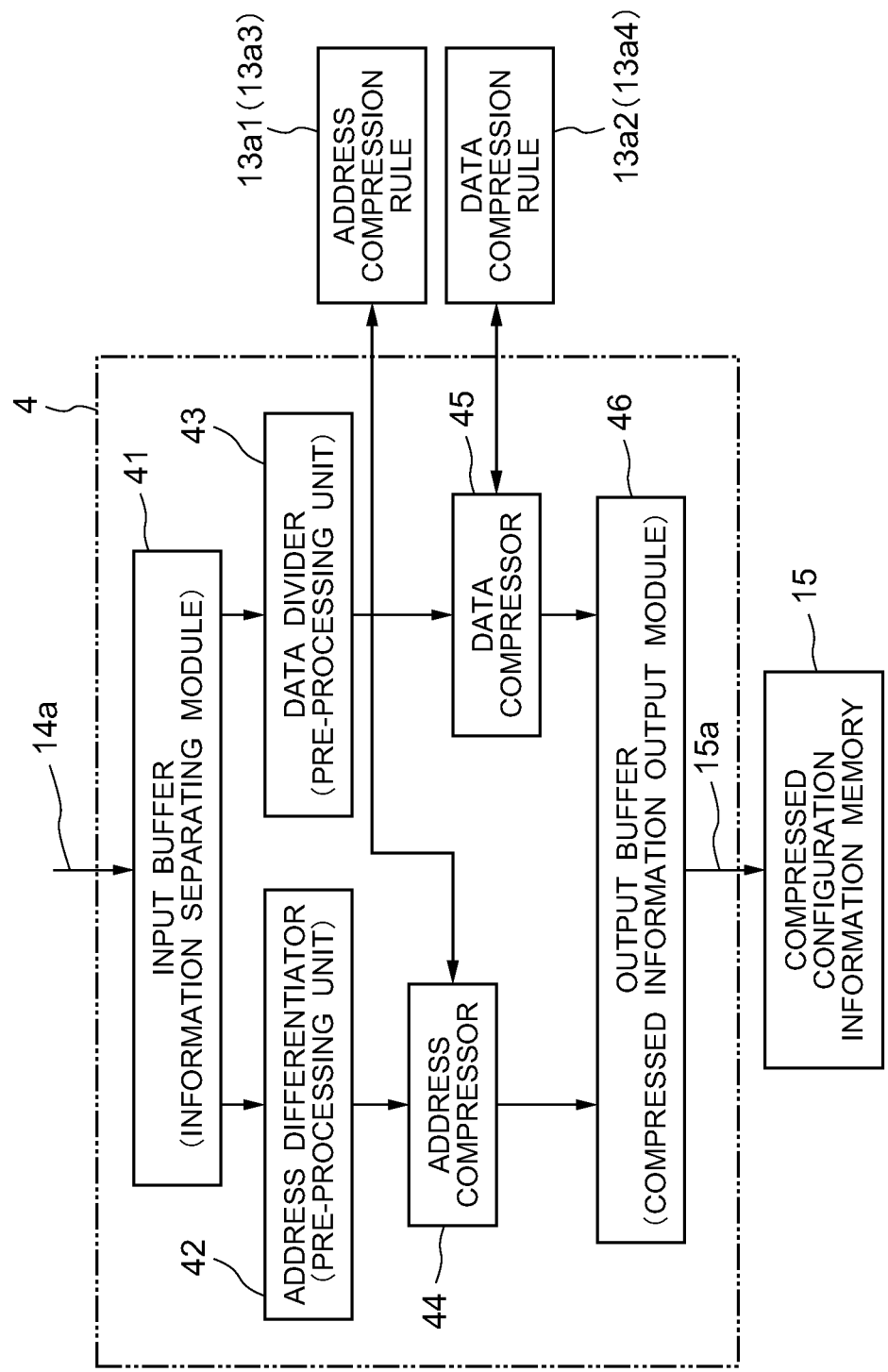

INFORMATION PROCESSING SYSTEM, INFORMATION COMPRESSION DEVICE, INFORMATION DECOMPRESSION DEVICE, INFORMATION PROCESSING METHOD, AND PROGRAM

TECHNICAL FIELD

The present invention relates to an information processing system and the like. More specifically, the present invention relates to an information processing system, an information compression device, an information restoring device, an information processing method, and a program thereof, which can improve the efficiency of the compression rate of configuration information including addresses and data.

BACKGROUND ART

Information systems such as computer systems are being spread broadly. In general, those information processing systems process information by using high-performance LSI such as CPU (Central Processing Unit). Recently, the performance of LSI other than CPU has been making a tremendous progress.

For example, reconfigurable devices such as FPGA (Field Programmable Gate Array) and CPLD (Complex Programmable Logic Device) can reconfigure logic circuits designed by users on the actual cites, so that those devices have drawn attentions because it is possible with those devices to reduce the development cost and to shorten the development time compared to those of ASIC that is a device of specific usage specification.

Due to the development of the high-performance reconfigurable device, the configuration information that can be loaded into the device tends to increase gradually. In the meantime, for example, extremely long time is required for loading vast amount of configuration information in a test and the like of the reconfigurable device, so that it takes more time in the test process than in main processing that is creation of a logic circuit.

In order to overcome this issue, some researches for compressing configuration information and decompressing (expanding) the information more efficiently have been presented.

For example, a compression method called LZ depicted in Non-Patent Document 1 is shown in FIG. 16. FIG. 16 is an illustration which schematically shows an example of a compression method under a research regarding compression of configuration information. In FIG. 16, a comparator/output device 502 searches whether or not a character string corresponding to an input character string 501a is contained in a referred character string dictionary 500. In a case where the input character string 501a is contained in the character string dictionary 500, the comparator/output device 502 outputs flag information indicating that the character string is contained, the start position of that character string in the character string dictionary 500, and the length of that character string.

In the meantime, in a case where the input character string 501a is not contained in the character string dictionary 500, the comparator/output device 502 outputs flag information indicating that the character string is not contained, and the uncontained input character string 501a itself. Thereafter, the oldest character string is erased from the character string dictionary 500, and the input character string 501a is newly added to the character string dictionary 500.

In the case of FIG. 16, a character string "BC" out of the input character string 501a is contained in the character string dictionary 500. Thus, as an output character string 503a, the comparator/output device 502 outputs flag information "Yes" indicating that the character string is contained, the start position "2" of the corresponding character string in the character string dictionary 500, and the length "2 (bytes)".

In the meantime, a next character string "R" out of the input character string 501a is not contained in the character string dictionary 500. Therefore, as the output character string 503a, the comparator/output device 502 outputs flag information "No" indicating that the character string is not contained, and the uncontained character string "R" itself. As a result, it is possible to compress the output character string 503a with respect to the input character string 501a (see Non-Patent Document 1).

Further, a compression method called X-Match is depicted in another document. FIG. 17 is an illustration which schematically shows the compression method of this research. In FIG. 17, a comparator/output device 602 searches whether or not a character string corresponding to an input character string 601a is contained in a referred character string group dictionary 600. In a case where the input character string 601a is contained in the character string group dictionary 600, the comparator/output device 602 outputs flag information indicating that the character string is contained, the position of the referred character string within the character string group dictionary 600, the position of the matching character in that character string, and the unmatched character string itself.

In the meantime, in a case where the input character string 601a is not contained in the character string group dictionary 600, the comparator/output device 602 outputs flag information indicating that the character string is not contained, and the uncontained input character string 601a itself. Thereafter, the oldest character string is erased from the character string group dictionary 600, and the input character string 601a is newly added to the character string group dictionary 600.

In the case of FIG. 17, a character string "B*R*JF (* is uncontained character string)" out of the input character string 601 is partially contained in "BQRTJF" of a referred character string 3 within the character string group dictionary 600. Thus, as an output character string 603a, the comparator/output device 602 outputs flag information "Yes" indicating that the character string is contained, the start position "3" of the referred character string, a bit string "101011" of the character positions indicating matching or unmatching state of that character string, and uncontained character strings "S" and "E". As a result, it becomes possible to compress the output character string 603a with respect to the input character string 601a (see Non-Patent Document 2).

Further, a compression method called FPC is depicted in another document. FIG. 18 is a schematic illustration of the compression method of this research. In FIG. 18, a comparator/output device 702 searches which of referred compression rules 700 a character string corresponding to an input character string 701a conforms to. In this case, all the input character strings are generated to conform to one of the compression rules without exceptions. Thus, as an output character string 703a, the comparator/output device 702 outputs the number of conformed compression rule, and a character string required for decompression (restoration).

In the case of FIG. 18, higher-order 16 bits "0123" and lower-order 16 bits "0123" of the input character string 701a match with each other. Thus, this conforms to a compression rule under the number "101" out of the compression rules 700, which is a rule indicating that the higher-order and lower-order 16 bits are the same. Therefore, as a character string 703a, the comparator/output device 702 outputs the conformed compression rule number "101", and the lower-order 16-bit character string "0123" required for decompression. As a result, it becomes possible to compress the output character string 703a with respect to the input character string 701a (see Non-Patent Document 3).

Other than the researches described above, there are also various kinds of researches proposed regarding compression processing of information (Patent Documents 1 to 3). For example, "Data Compression Device and Method" according to Patent Document 1 provides a compression/expansion system for increasing the capacity of digital storage devices such as magnetic disk storage devices and magnetic tape storage devices. In this document, depicted are a compression unit and an expansion unit mounted into a single integrated circuit that is a part of a data storage system or a data transmission system controlled by a microprocessor. For example, the compression unit performs compression processing on uncompressed data received from a host and transmits it to a device under a control of a controller MPU (microprocessor).

In the meantime, the expansion unit performs expansion processing on the compressed data received from the device and transmits it to the host under a control of the controller MPU. In this case, the history of data that are compression-processed and expansion-processed previously is stored in a RAM, and the history is utilized when matching data is received.

Further, in "Silicon Storage Medium Control Method and Silicon Storage Medium" according to Patent Document 2, the silicon recording medium includes a controller and at least a single memory. The controller is structured to include a microprocessor, a data compressor, a data restorer, and also a conversion table buffer as well as an address mapping module.

Further, in "Program Code Compression Method Making It Possible to Perform High-Speed Prototyping of Code Compression Technique, Program Code Compression System" according to Patent Document 3, depicted is a structure with which the effect of program code compression can work entirely through executing compression release on the fly at a position close to a processor by using XTensa processor of Tensilica as a base to increase a memory and a bus bandwidth.

For example, as shown in architecture, it is so structured that a signal sent from a cache or a tag is changed so that the signal is not intercepted by a compression release engine and the existence of the compression code is not recognized by the CPU. Further, as shown in a flowchart, there is also depicted processing for separating the program codes and the data.

Patent Document 1: Japanese Unexamined Patent Publication 2000-201081
Patent Document 2: Japanese Unexamined Patent Publication 2005-322209
Patent Document 3: Japanese Unexamined Patent Publication 2007-234048
Non-Patent Document 1: T. A. Welch, A Technique for High-Performance Data Compression, IEEE Computer, pp. 8-19 (1986)
Non-Patent Document 2: M. Kjelso, M. Gooch, S. Jones, Design and Performance of a Main Memory Hardware Data Compressor, IEEE Proceedings of EUROMICRO-22, pp. 423-30 (September 1996)
Non-Patent Document 3: A. R. Alameldeen, D. A. Wood, Frequent Pattern Compression: A Significance-Based Compression Scheme for L2 Caches (2004)

DISCLOSURE OF THE INVENTION

Problems to be Solved by the Invention

However, in the cases of Non-Patent Document 1 and Non-Patent Document 2 described above, it is necessary to have a great number of character string samples to be referred in order to acquire a high compression rate. Therefore, a character string dictionary of a large memory capacity is required. Thus, the dictionary memory used therein becomes expensive, so that the product cost becomes increased. Further, the disclosed contents of each of the other documents are structured to process addresses and data of different characteristics without distinction. Therefore, the compression rate of the addresses ad data is low (cannot achieve a large compression rate).

It is therefore an object of the present invention to provide an information processing system, an information compression device, an information restoring device, an information processing method, and a program thereof, which can set a high compression rate of the addresses and data when performing transmission or storage processing of configuration information containing the addresses and data having different characteristics from each other.

Means for Solving the Problems

In order to achieve the foregoing object, the information processing system according to the present invention is characterized to include an information compressor which inputs and compresses configuration information containing addresses and data, wherein the information compressor includes: an information separating module which divides the configuration information into address information and data information; an address compressor and a data compressor, which individually compress the separated address information and data information, respectively; and a compressed information output module which integrates the compressed address information and data information, and outputs as compressed configuration information.

Further, in order to achieve the foregoing object, the information compression device according to the present invention is characterized as an information compression device including an information compressor which is targeted to compress configuration information containing addresses and data, wherein the information compressor includes: an information separating module which divides the configuration information into address information and data information; an address compressor and a data compressor, which individually compress the separated address information and data information based on individually set compression rules set in advance, respectively; compression pre-processing units provided in each input stage of the address compressor and the data compressor, respectively, to perform pre-processing to provide an easily compressible state individually by corresponding to characteristics of the address information and the data information, respectively; and a compressed information output module which integrates the compressed address information and data information, and outputs as compressed configuration information.

Furthermore, in order to achieve the foregoing object, the information restoring device according to the present invention is characterized as an information restoring device including an information decompressor which inputs and decompresses compressed configuration information in which compressed address information and compressed data information is integrated, and a restoring control device which controls external output of configuration information that is constituted with the decompressed address information and data information, wherein: the information decompressor includes: a compressed information separating module which divides the compressed configuration information into compressed address information and compressed data information; an address decompressor and a data decompressor, which individually decompress the separated compressed address information and compressed data information based on compression rules that are same as compression rules used at the time of compression, respectively; decompressed information after-processing units provided at each output stage of the address decompressor and the data decompressor, respectively, to perform restoration processing to acquire the uncompressed address information and data information; and a configuration information output module which re-integrates the restored address information and data information, and outputs t as configuration information.

Moreover, in order to achieve the foregoing object, the information processing method according to the present invention is characterized as an information processing method which includes: inputting configuration information containing addresses and data; separating the configuration information into address information and data information; individually compressing the separated address information and data information based on individually set respective compression rules set in advance; and integrating the compressed address information and data information, and outputting as compressed configuration information.

Further, in order to achieve the foregoing object, the information processing program according to the present invention is characterized as an information processing program for causing a computer to execute a compression processing function which compression-processes configuration information and a compressed information storing processing function which stores compressed configuration information that is the configuration information being compressed to a storage module as decompression target information, wherein: the compression processing function includes: an information separating processing function which divides the configuration information into address information and data information; an address compression processing function and a data compression processing function, which individually compression-process the separated address information and data information based on individually set compression rules set in advance; and a compressed configuration information output processing function which integrates the compressed address information and data information, and outputs as compressed configuration information.

Effect of the Invention

The present invention is structured to separate the address information and the data information, to perform compression processing individually, and to perform integration processing when performing transmission or storage processing of the information containing the addresses and data having different characteristics form each other. Therefore, it is possible to achieve a high compassion rate of the configuration information containing the addresses and the data.

BRIEF DESCRIPTION OF THE DRAWINGS

FIG. 6 is an illustration showing other examples of the compression rules according to the exemplary embodiment;

FIG. 7 is a block diagram showing an inside structure of the compressor shown in FIG. 4;

BEST MODES FOR CARRYING OUT THE INVENTION

Figure 1:
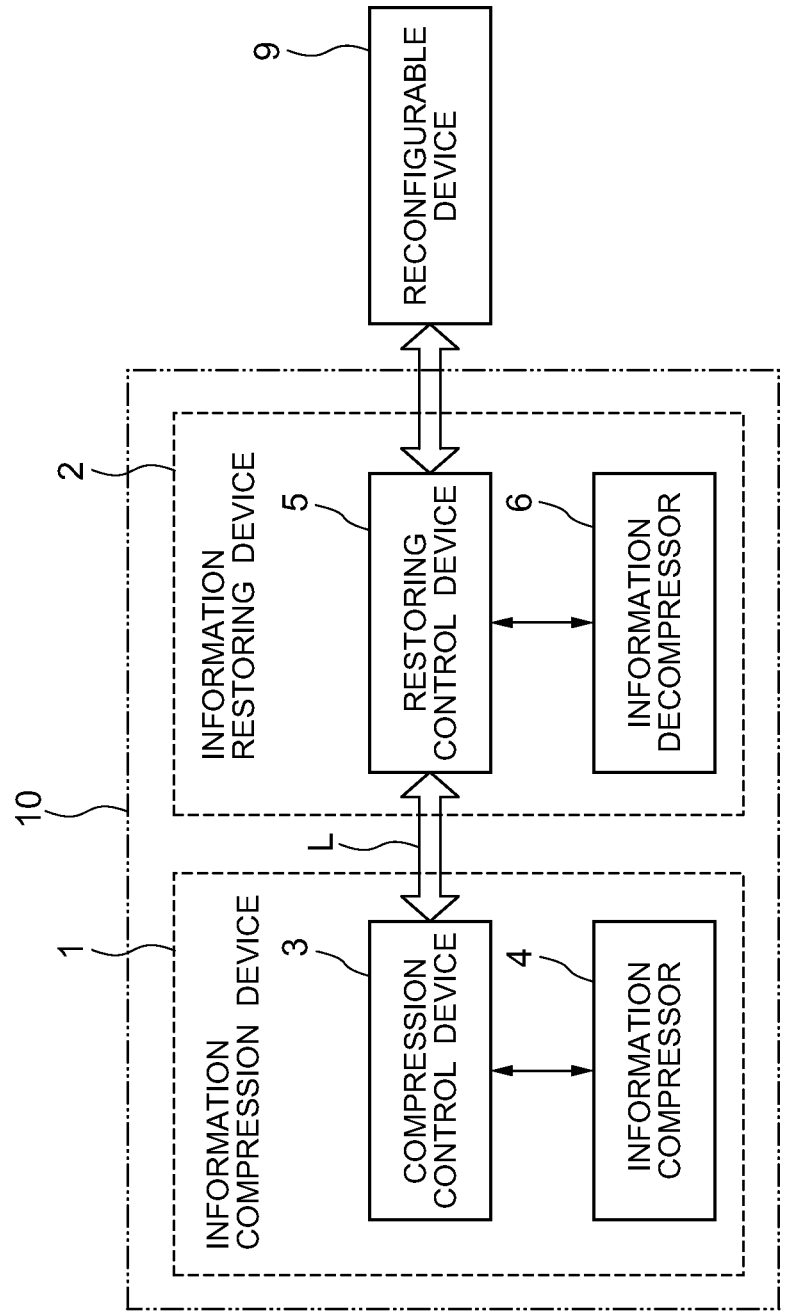
FIG. 1 is a schematic block diagram showing an information processing system of the present invention.

Hereinafter, an exemplary embodiment regarding the information processing system, the information compression device, the information restoring device, the information processing method, and the information processing program according to the present invention will be described by referring to the accompanying drawings.

First, basic contents of this exemplary embodiment will be described, and specific contents will be described thereafter.

(Basic Contents)

Referring to FIG. 1 to FIG. 4, the information processing system 10 is formed by an information compression device 1, and an information restoring device 2 which restores compressed information.

The information compression device 1 is formed by including an information compressor 4 which receives and compresses configuration information 14a containing addresses and data, and a compression control device 3 which controls operations of the information compressor 4.

Figure 2:
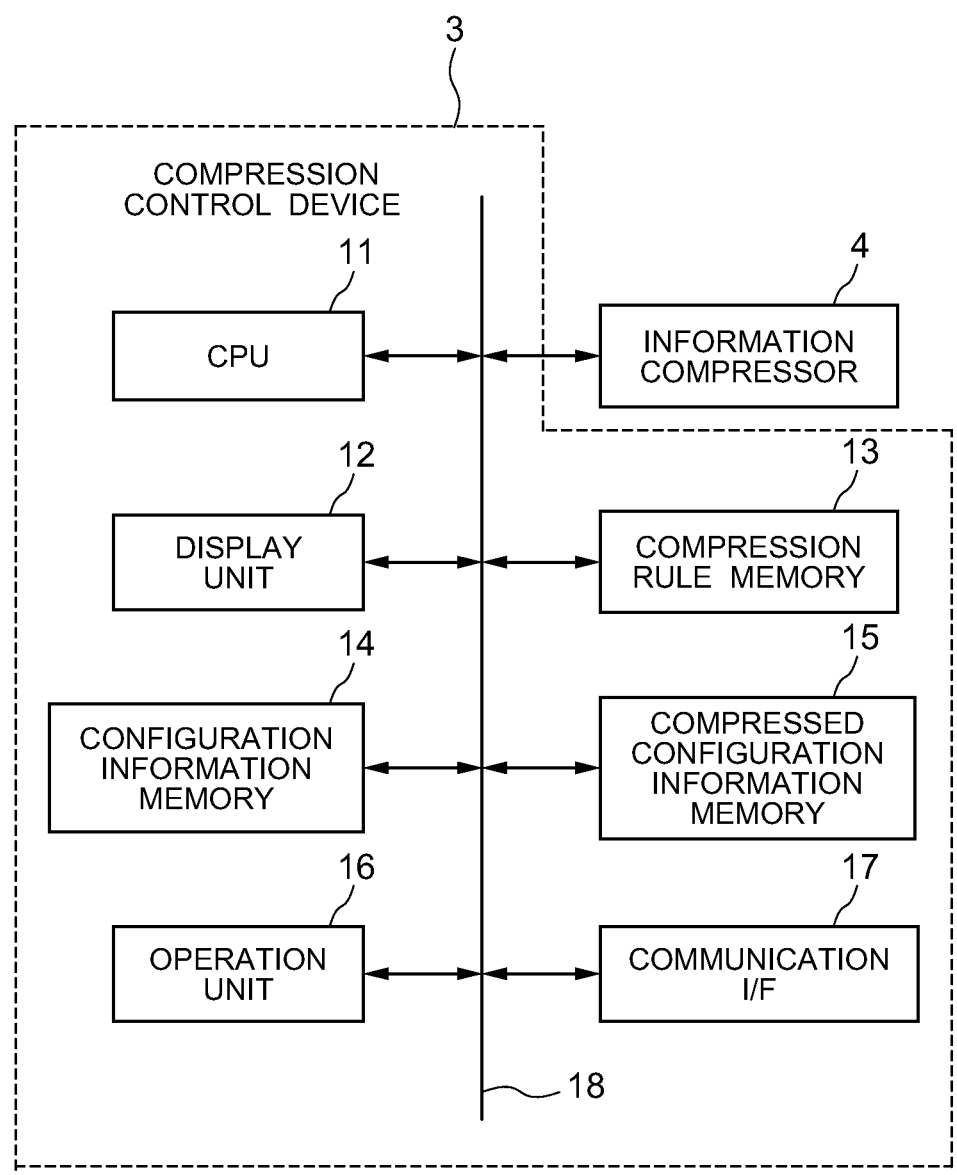
FIG. 2 is a schematic block diagram showing an inside system of a compression control device of an information compression device shown in FIG. 1.

As shown in FIG. 2, the compression control device 3 includes a compressed configuration information memory 15 as a compressed configuration information storage module which stores, as decompression-target information, compressed configuration information 15a that is the configuration information compressed by the information compressor 4.

As shown in FIG. 7, the information compressor 4 includes: an input buffer 41 which functions as an information separating module for separating the configuration information 14a into address information and data information; an address compressor 44 and a data compressor 45, which individually compress the address information and the data information separated by the input buffer 41, respectively; and an output buffer 46 as a compressed information output module which integrates the compressed address information and data information, and outputs it as compressed configuration information.

Further, this information compressor 4 includes compression pre-processing units 42 and 43 at respective input stages of the address compressor 44 and the data compressor 45. Out of those, the compression pre-processing unit 42 of the address compressor 44 in this exemplary embodiment is formed by an address differentiator which performs differentiation processing on the address information. As the address differentiator 42, used is a differentiator which outputs a difference between the address being processed and the address processed right before.

Further, the compression preprocessing unit 43 of the data compressor 45 in this exemplary embodiment is formed by a data divider which divides the data information. As the data divider 43, used in this exemplary embodiment is a divider which divides the bit number of a data sequence of data information to ½ of the bit number (e.g., 32-bit data is divided into two pieces of 16-bit data).

Furthermore, each of the address compressor 44 and the data compressor 45 described above is structured to execute compression processing independently based on own compression rules 13a1 and 13a2 (see FIG. 5) which are set in advance in accordance with the characteristics of the respective compressed information.

Further, as described above, the compressed configuration information 15a compressed by the information compressor 4 is stored in the compressed configuration information memory (compressed information storage module) 15 as the decompression-target information. Since the configuration information 14a is stored by being compressed greatly, it is sufficient for the compressed configuration information memory (compressed information storage module) 15 to have only a small storage capacity.

The compressed configuration information stored in the compressed configuration information memory 15 is decompressed by an information decompressor 6 in a following manner after being transmitted via a communication line (or directly without being transmitted), and sent to a reconfigurable device 9, for example.

Reference numeral 2 shows the information restoring device which decompresses the compressed configuration information 15a stored in the compressed configuration information memory (compressed information storage module) 15.

The information restoring device 2 includes: the information decompressor 6 which inputs the compressed configuration information in which the compressed address information and the compressed data information is integrated; and a restoring control device 5 which controls external output of the configuration information constituted with the address information and the data information decompressed by the information decompressor 6 and also controls the entire operations of the information decompressor 6.

The information decompressor 6 constituting the main part of the information restoring device 2 is formed by including: an input buffer 61 as a compressed information separating module which divides the compressed configuration information into the compressed address information and the compressed data information; an address decompressor 62 and a data decompressor 63, which individually decompress the compressed address information and the compressed data information separated by the input buffer 61, respectively; and an output buffer 66 as a configuration information output module which reintegrates the decompressed address information and the decompressed data information, and outputs it as configuration information.

Further, decompression after-processing units 64 and 65, which perform restoration processing on the decompressed address information and data information into the address information and data information before being compressed are mounted at respective output stages of the address decompressor 62 and the data decompressor 63 of the information decompressor 6 in a corresponding manner.

Out of those, the decompressed information after-processing unit corresponding to the address decompressor 62 in this exemplary embodiment is formed by an address adder 64 which outputs the sum of the currently-processed address and the address processed right before. Further, the decompressed information after-processing unit corresponding to the data decompressor 63 in this exemplary embodiment is formed by a data coupler 65 which couples the data information being divided by the data divider 43 (e.g., two-pieces of 16-bit data are coupled into 32-bit data).

Furthermore, each of the address decompressor 62 and the data decompressor 63 described above is structured to execute decompression processing independently based on the corresponding compression rules 13a1 and 13a2 (see FIG. 10) which are set in advance. This will be described in more details hereinafter.

(Entire Structure of System)

FIG. 1 is a schematic block diagram of a case where the information processing system of the present invention is applied to a reconfigurable device developing system. In FIG. 1, the information compression device 1 and the information restoring device 2 are connected via LAN and another communication line L to form the information processing system 10. The information processing system 10 is connected to the reconfigurable device (e.g., FPGA) 9. The information processing system 10 promptly outputs a vast amount of configuration information including addresses and data towards the reconfigurable device 9 for generating a logic circuit of the reconfigurable device 9 in response to an operation of a user.

As shown in FIG. 1, the information compression device 1 of the information processing system 10 is formed by the compression control device 3 and the information compression device 4. Further, the information restoring device 2 of the information processing system 10 is formed by the restoring control device 5 and the information restoring device 6. Note here that the structure of the information processing system 10 is merely an example of the exemplary embodiment, and the present invention is not limited to the form shown in FIG. 1. For example, the information compression device 1 and the information restoring device 2 may be integrated to form the system with a single information compression/restoring device which houses both the compressor 3 and the information restoring device 6.

FIG. 2 is a block diagram of an inside system of the compression control device 3 shown in FIG. 1. As shown in FIG. 2, the compression control device 3 includes a CPU 11, a display unit 12, a compression rule memory 13, a configuration information memory 14, a compressed configuration information memory 15, an operation unit 16, and a communication/interface (I/F) 17, and these are connected mutually via a bus 18. The information compressor 4 shown in FIG. 1 is also connected to the bus 18.

The CPU 11 is formed by a one-chip processor having built-in program ROM, work RAM, cache memory, and the like (not shown). The operation unit 16 inputs configuration information containing addresses and data for generating a logic circuit of the reconfigurable device 9 shown in FIG. 1 in response to an operation of the user. The display unit 12 displays messages for the user, contents of the inputted configuration information, and the like.

The configuration information memory 14 is a buffer which temporarily stores the inputted configuration information 14a. The compression rule for the compression processing executed by the information compression device 4 is stored in advance to the compression rule memory 13. The compressed configuration information memory 15 is a buffer which temporarily stores the compressed configuration information 15a when the configuration information 14a stored in the configuration information memory 14 is compressed by the information compression device 4.

The compression processing executed by the information compression device 4 and the compression rule thereof will be described later. The communication/interface 17 transmits the compressed configuration information 15a temporarily stored in the compressed configuration information memory 15 to the information restoring device 2 shown in FIG. 1 via the communication line L. As will be described later, the configuration information is compressed with a high compression rate in this exemplary embodiment, so that the transmission time of the compressed configuration information 15a from the information compression device 1 to the information restoring device 2 can be shortened greatly.

In this case, the configuration information memory 14 and the compressed configuration information memory 15 are formed by separate memories. However, those may be formed as different storage areas of a single memory. Alternatively, those may be formed as storage areas of the work RAM or the cache memory, not shown, built inside the CPU 11.

In the cases of any of those structures, it simply needs to be able to temporarily store the configuration information 14a inputted from the operation unit 16, to perform compression processing, and to properly transmit the compressed configuration information 15a to the information restoring device 2 shown in FIG. 1. Thus, it is unnecessary to store the configuration information 14a and the compressed configuration information 15a entirely. Therefore, it is possible to achieve those with non-volatile memories of a small storage capacity (e.g., inexpensive RAM).

Figure 3:
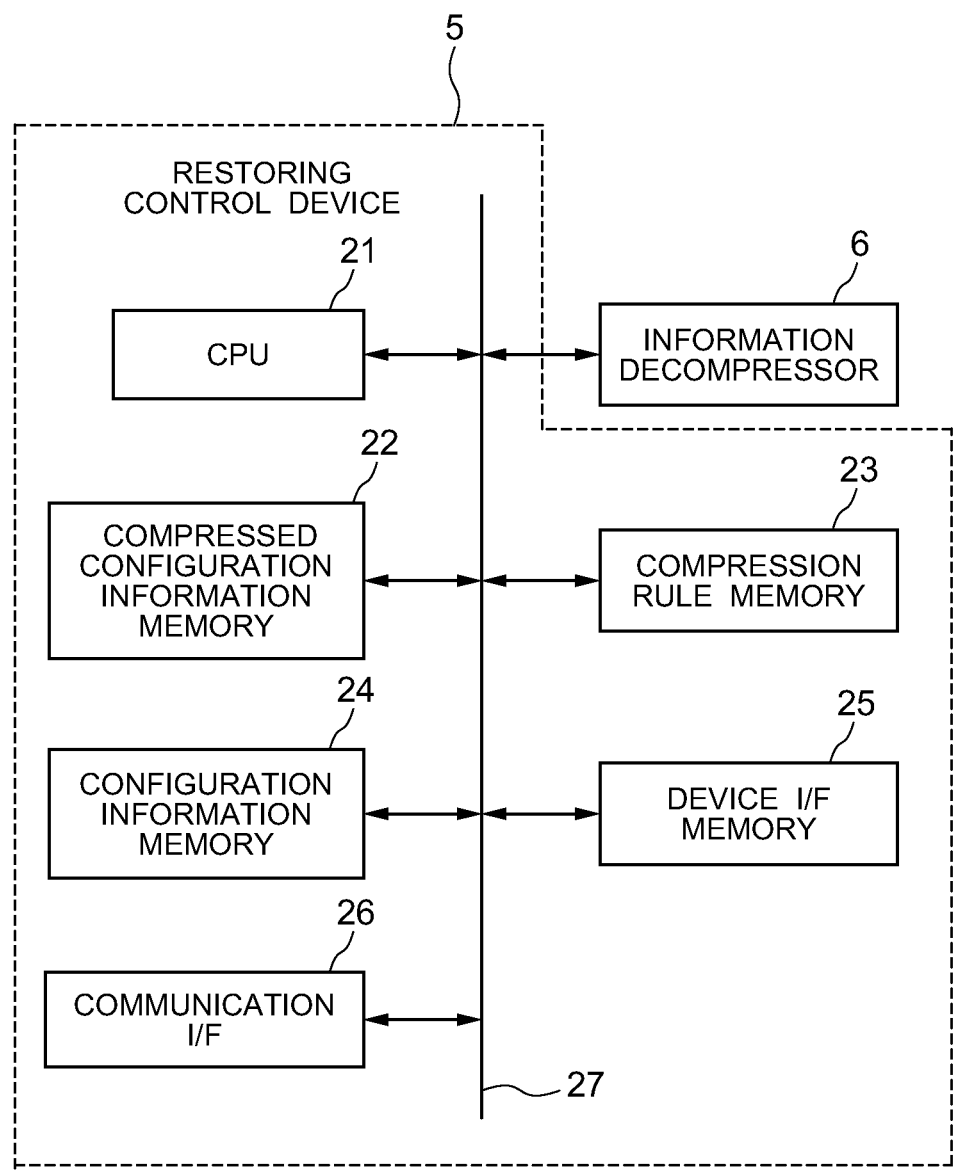
FIG. 3 is a schematic block diagram showing an inside system of a restoring control device of an information restoring device shown in FIG. 1.

FIG. 3 is a block diagram of an inside system of the restoring control device 5 shown in FIG. 1. As shown in FIG. 3, the restoring control device 5 includes a CPU 21, a compressed configuration information memory 22, a compression rule memory 23, a configuration information memory 24, a device interface (I/F) 25, and a communication interface 26, and these are connected mutually via a bus 27. The information decompressor 6 shown in FIG. 1 is also connected to the bus 27.

The CPU 21 is formed by a one-chip processor having built-in program ROM, work RAM, cache memory, and the like (not shown). The communication interface 26 receives the compressed configuration information transmitted from the communication interface 17 of the compression control device 3 shown in FIG. 2. The compressed configuration information memory 22 stores the compressed configuration information 15a received by the communication interface 26. The compressed configuration information memory 22 is formed by a nonvolatile memory such as a flash ROM. The compression rule memory 23 stores the compression rule which is referred by the information restoring device 6, when the information restoring device 6 performs decompression processing of the compressed configuration information 15a stored in the compressed configuration information memory 22.

The compression rule is the same compression rule that is stored in the compression rule memory 13 of the compression control device 3 shown in FIG. 2. The configuration information memory 24 stores the original configuration information 14a that is decompression-processed by the information restoring device 6 and then restored. The decompression processing of the information restoring device 6 will be described later. The device interface 25 outputs the configuration information 14a stored in the configuration information memory 24 to the reconfigurable device 9 shown in FIG. 1.

In this case, the compressed configuration information memory 23 stores the compressed configuration information 15a received properly from the compression control device 3 shown in FIG. 2 every time. At last, the compressed configuration information memory 23 needs to collectively store all the compressed configuration information 15a, and to keep it even when the power of the device is turned off. Therefore, it is desirable to form the compressed configuration information memory 23 by a nonvolatile memory such as a flash ROM. However, as will be described later, the configuration information 14a is compressed with a high compression rate in this exemplary embodiment, so that the capacity of the compressed configuration information memory 23 can be suppressed by a great amount.

In the meantime, the configuration information memory 24 simply needs to read out the compressed configuration information 15a stored in the compressed configuration information memory 23 by the CPU 21 by a certain unit (e.g., several bytes), to perform decompression processing by the information restoring device 6, to temporarily store the restored original configuration information 14a, and then to output it to the reconfigurable device 9 via the device interface 25. Therefore, the stricture information memory 24 can be achieved by a nonvolatile memory of a small storage capacity (e.g., inexpensive DRAM). Alternatively, the configuration information memory 24 may be formed by a storage area of the work RAM or the cache memory, not shown, built inside the CPU 21.

(Compression Processing)

Next, the compression processing of the information compression device 1 will be described by referring to FIG. 4 to FIG. 8.

Figure 4:
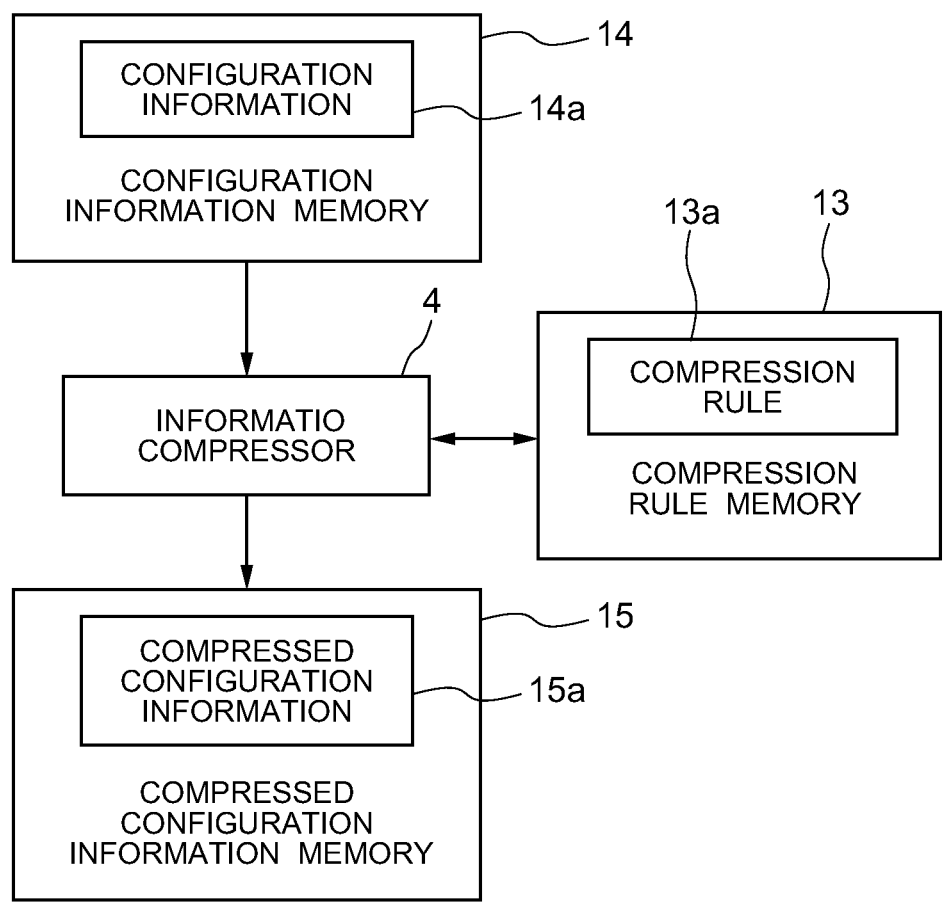
FIG. 4 is an illustration showing functions of a compressor shown in FIG. 2.

FIG. 4 is an illustration showing the functions of the information compressor 4 shown in FIG. 1 and FIG. 2. In FIG. 4, the information compressor 4 refers to the compression rule 13a in the compression rule memory 13, performs the compression processing on the configuration information 14a read out by the CPU 11 from the configuration information memory 14 of the compression control device 3 shown in FIG. 2 to generate the compressed configuration information 15a, and stores it to the configuration information memory 15 of the compression control device 3.

Regarding the information compressor 4 disclosed in FIG. 4, each of the functions as the execution contents thereof may be structured by a specific program working on the CPU or may be structured by an electronic circuit as an integrated circuit.

Figure 5A:
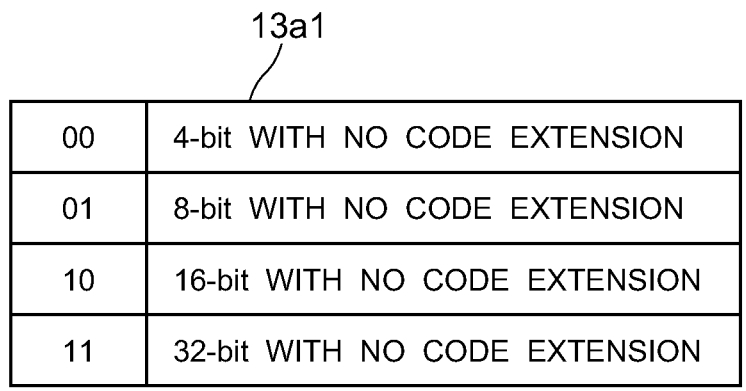
FIG. 5 is an illustration showing examples of compression rules according to an exemplary embodiment.
Figure 5B:
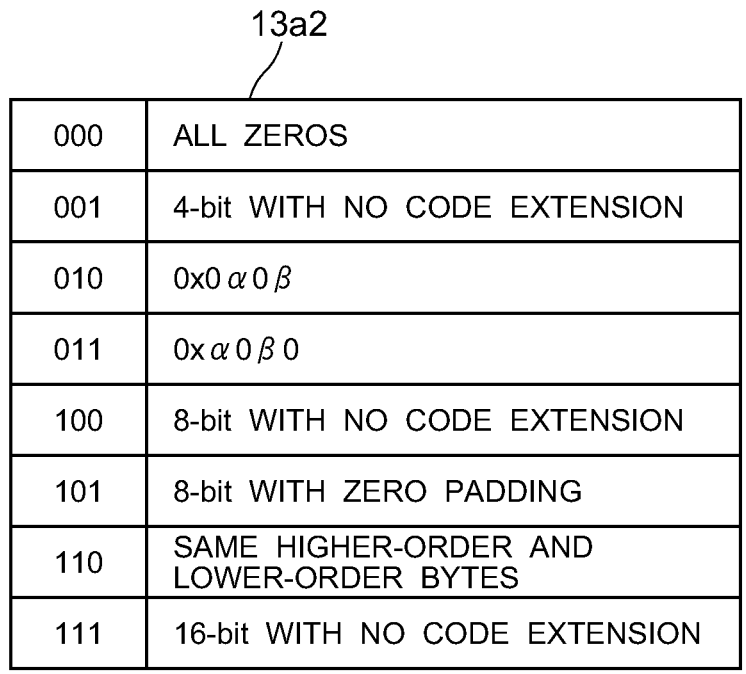

FIG. 5 is an illustration showing examples of the compression rules according to the exemplary embodiment. The compression rules are constituted with the address compression rule 13a1 shown in FIG. 5A and the data compression rule 13a2 shown in FIG. 5B. While the details will be described later, the configuration information 14a read out from the configuration information memory 14 is separated into the addresses and data, and each of those is individually compression-processed by referring to the address compression rule 13a1 and the data compression rule 13a2, respectively.

The address compression rule 13a1 is constituted with four rules. Correspondingly, the information compressor 4 outputs code "00" and 4-bit data for 4-bit address with no code extension.

Further, the information compressor 4 outputs code "01" and 8-bit data as a compressed address for 8-bit address with no code extension. Furthermore, the information compressor 4 outputs code "10" and 16-bit data as the compressed address for 16-bit address with no code extension. Moreover, the information compressor 4 outputs code "11" and 32-bit data as the compressed address for 32-bit address with no code extension.

In the meantime, the data compression rule 13a2 is constituted with eight rules. In the data compression rule 13a2, α and β show arbitrary 4-bit data.

The information compressor 4 outputs only code "000" as the compressed data for data with all zeros. Further, the information compressor 4 outputs code "001" and 4-bit data as the compressed data for 4-bit data with no code extension.

Furthermore, the information compressor 4 outputs code "010" and 8-bit data as the compressed data for 16-bit data constituted with "0x0α0β". Moreover, the information compressor 4 outputs code "011" and 8-bit data as the compressed data for 16-bit data constituted with "0xα0β0".

Further, the information compressor 4 outputs code "100" and 8-bit data as the compressed data for 8-bit data with no code extension.

Furthermore, the information compressor 4 outputs code "101" and 8-bit data as the compressed data for 16-bit zero-padded data "0xαβ00".

Moreover, the information compressor 4 outputs code "110" and 8-bit data as the compressed data for 16-bit data "0xαβαβ" whose higher-order bit and lower-order bit are the same. Further, the information compressor 4 outputs code "111" and 16-bit data as the compressed data for 16-bit data with no code extension.

FIG. 6 is an illustration showing other examples of the compression rules according to the exemplary embodiment. The compression rules are constituted with an address compression rule 13a3 shown in FIG. 6A and a data compression rule 13a4 shown in FIG. 6B. Out of those, the address compression rule 13a3 is constituted with four rules. Correspondingly, the information compressor 4 outputs code "0" and 4-bit data as a compressed address for 4-bit address with no code extension.

Further, the information compressor 4 outputs code "10" and 8-bit data as the compressed address for 8-bit address with no code extension. Furthermore, the information compressor 4 outputs code "110" and 16-bit data as the compressed address for 16-bit address with no code extension. Moreover, the information compressor 4 outputs code "111" and 32-bit data as the compressed address for 32-bit address with no code extension.

In the meantime, the data compression rule 13a4 is constituted with eight rules. In the data compression rule 13a4, α and β show arbitrary 4-bit data. Correspondingly, the information compressor 4 outputs only code "0" as the compressed data for the data with all zeros. Further, the information compressor 4 outputs code "1110" and 4-bit data as the compressed data for 4-bit data with no code extension.

Furthermore, the information compressor 4 outputs code "1111" and 8-bit data as the compressed data for 16-bit data constituted with "0x0α0β". Moreover, the information compressor 4 outputs code "110" and 8-bit data as the compressed data for 16-bit data constituted with "0xα0β0". Further, the information compressor 4 outputs code "10110" and 8-bit data as the compressed data for 8-bit data with no code extension.

Furthermore, the information compressor 4 outputs code "10111" and 8-bit data as the compressed data for 16-bit zero-padded data "0xαβ00". Moreover, the information compressor 4 outputs code "1010" and 8-bit data as the compressed data for 16-bit data "0xαβαβ" whose higher-order bit and lower-order bit are the same. Further, the information compressor 4 outputs code "100" and 16-bit data as the compressed data for 16-bit data with no code extension.

FIG. 7 is a block diagram showing a specific inside structure of the information compressor 4 shown in FIG. 4.

Referring to FIG. 7, as described above, the information compressor 4 is constituted with the input buffer 41, the address differentiator 42, the data divider 43, the address information compressor 44, the data information compressor 45, and the output buffer 46.

The input buffer 41 temporarily stores the uncompressed configuration information 14a read out from the configuration information memory 14 shown in FIG. 2, separates the addresses and the data, and outputs those to the address differentiator 42 and the data divider 43, respectively. The address differentiator 42 calculates a difference between the currently-processed address and the address processed right before, and outputs the calculated difference address to the address information compressor 44. The data divider 43 divides the 32-bit data sequence into ½, i.e., 16-bit data each, and outputs the divided data to the data information compressor 45.

Here, the address information compressor 44 compresses the difference address acquired by the address divider 42 by referring to the address compression rule 13a1 or 13a3 shown in FIG. 5A or FIG. 6A, and outputs the compressed difference address to the output buffer 46. The data information compressor 45 compresses the divided data acquired by the data divider 43 by referring to the data compression rule 13a2 or 13a4 shown in FIG. 5B or FIG. 6B, and outputs the compressed divided data to the output buffer 46.

The output buffer 46 generates the compressed configuration information 15a by integrating the compressed difference address acquired from the address information compressor 44 and the compressed divided data acquired from the data information compressor 45, and stores it to the compressed configuration information memory 15 shown in FIG. 2.

As described, the information compressor 4 shown in FIG. 7 includes: the input buffer (separating module) 41 which operates as the separating module for separating the addresses and the data contained in the inputted information; the address differentiator 42 which calculates the difference address by performing arithmetic operation of the current address separated by the input buffer 41 and the address right before; and the data divider 43 which generates the divided data by dividing the data separated by the input buffer (separating module) 41 into a plurality of pieces.

As described above, the information compressor 4 includes: the address information compressor (address compressor) 44 which generates the compressed difference address by performing the compression processing on the difference address acquired from the address differentiator 42; the data information compressor (data compressor) 45 which generates the compressed divided data by performing the compression processing on the divided data acquired from the data divider 43; and the output buffer 46 operating as a compressed configuration information integration/output module which integrates the compressed difference address acquired from the address information compressor 44 and the compressed divided data acquired from the data information compressor 45, outputs it as the compressed configuration information 15a and stores it to the compressed configuration information memory 15 shown in FIG. 2.

Here, the address information compressor 44 generates the compressed difference address through performing the compression processing on the difference address acquired from the address differentiator 42 by referring to the address compression rule 13a1 or 13a3. Further, the data information compressor 45 has a function which generates the compressed divided data through performing the compression processing on the divided data acquired from the data divider 43 by referring to the data compression rule 13a2 or 13a4. The address information and the data information can be effectively and greatly compression-processed by the two compressors 44 and 45, respectively.

Next, the compression processing operations of the information processor 4 according to the exemplary embodiment will be described by referring to a flowchart shown in FIG. 8. First, the configuration information 14a read out from the configuration information memory 14 shown in FIG. 2 is inputted (step S101), and the configuration information 14a is separated into the addresses and data (step S102). Then, the addresses and the data are independently pre-processed (step S103).

That is, a difference between the currently-processed address and the address processed right before is calculated for the address information, and 32-bit data sequence is divided into ½, i.e., 16-bit each, for the data information. Then, the address and the data are independently compressed (step S104). Thereafter, the compressed address and the compressed data are integrated to generate the compressed configuration information 15a (step S105). Then, the compressed configuration information 15a is stored in the compressed configuration memory (compressed configuration information storage module) 15 that is shown in FIG. 2 (step S106).

(Decompression Processing)

Next, the decompression processing of the information restoring device 2 shown in FIG. 1 will be described by referring to FIG. 9 to FIG. 11.

Figure 9:
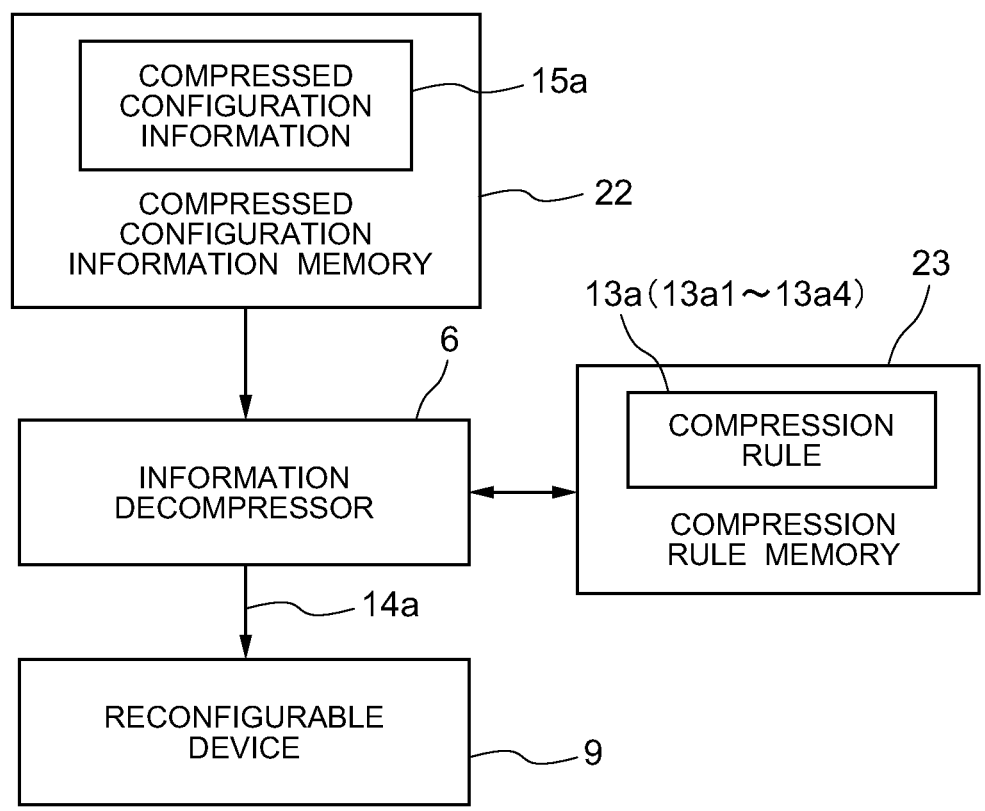
FIG. 9 is an illustration showing functions of the information restoring device shown in FIG. 3.

FIG. 9 is an illustration showing the functions of the information decompressor 6 shown in FIG. 1 and FIG. 3. In FIG. 9, the information decompressor 6 performs the decompression processing on the compressed configuration information 15a read out from the compressed configuration information memory 22 shown in FIG. 3 by referring to the compression rules 13a (13a1 to 13a4) stored in the compression rule memory 23 of the restoring control device 4 shown in FIG. 3, i.e., the same compression rules stored in the compression rule memory 13 of the compression control device 4 shown in FIG. 2 to restore it to the original uncompressed configuration information 14a shown in FIG. 4, and outputs it to the reconfigurable device 9 shown in FIG. 1.

Figure 10:
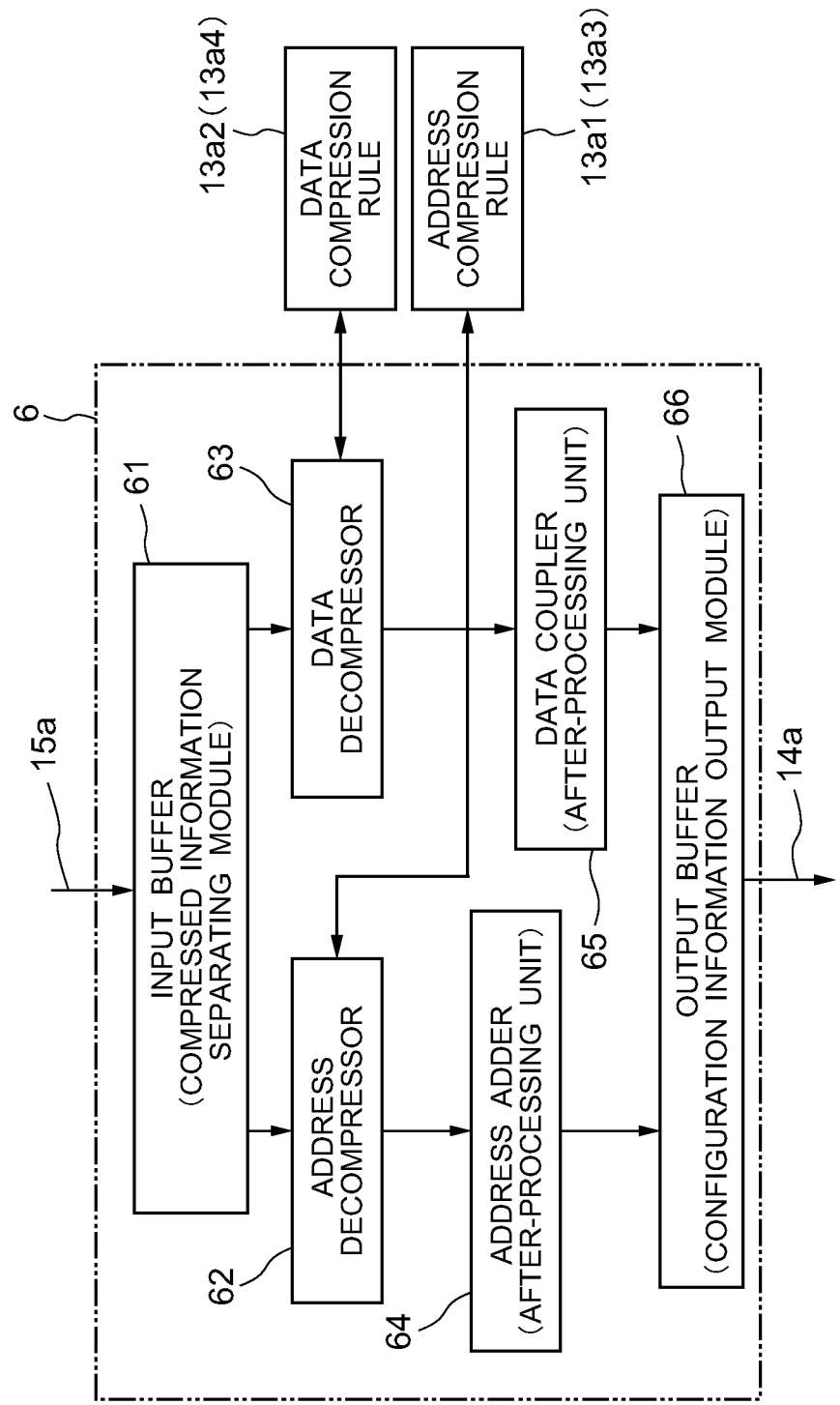
FIG. 10 is a block diagram showing an inside structure of the information restoring device shown in FIG. 9.
Figure 11:
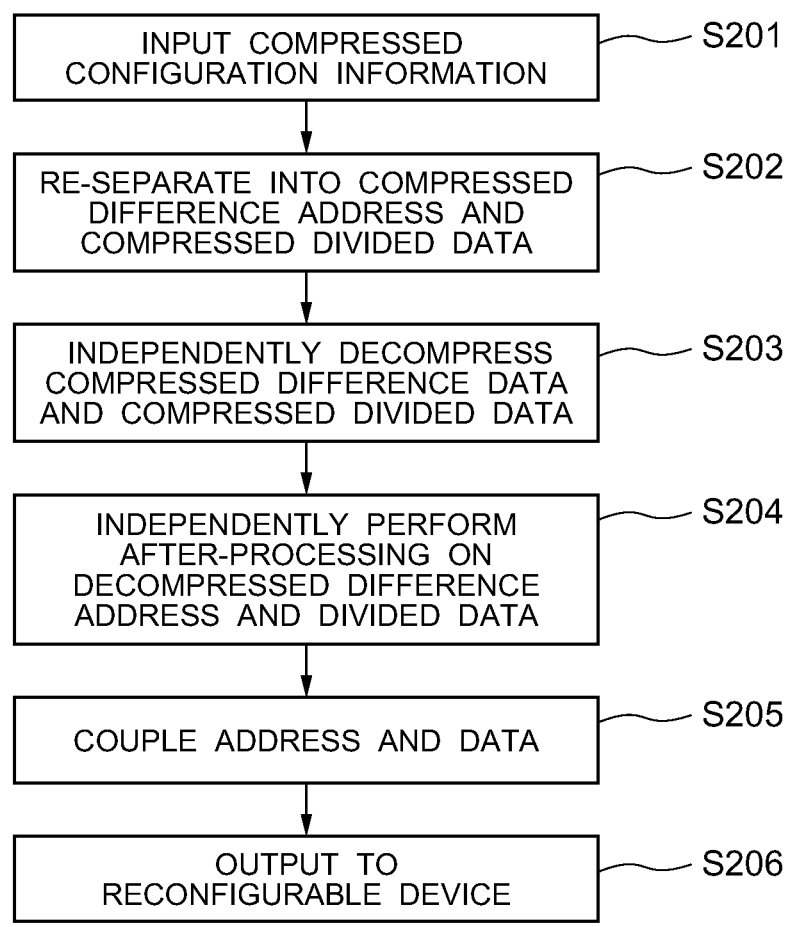
FIG. 11 is a flowchart showing operations of decompression processing executed by the information restoring device that is partially shown in FIG. 1.

FIG. 10 is a block diagram showing the inside structure of the information decompressor 6. As described above, the information decompressor 6 is constituted with an input buffer 61, an address information decompressor 62, a data information decompressor 63, an address adder 64, a data coupler 65, and an output buffer 66.

The input buffer 61 reads out compressed configuration information 22a in which the compressed difference address and the compressed divided data are coupled from compressed configuration information memory 22 shown in FIG. 3, re-separates it to the compressed difference address and the compressed divided data, and outputs those to the address information decompressor 62 and the data information decompressor 63, respectively.

The address decompressor 62 performs the decompression processing on the compressed difference address acquired from the input buffer 61 by referring to the address compression rule 13a1 or 13a3 in the compression rule memory 23 shown in FIG. 9 to restore it to the uncompressed difference address, and outputs it to the address adder 64. The data information decompressor 63 performs the decompression processing on the compressed divided data acquired from the input buffer 61 by referring to the data compression rule 13a2 or 13a4 in the compression rule memory 23 shown in FIG. 9 to restore it to the uncompressed divided data, and outputs it to the data coupler 65.

The address adder 64 adds the currently-processed difference address and the difference address processed right before to restore the original address, and outputs the address to the output buffer 66. The data coupler 65 couples the two-system 16-bit divided data into the undivided one-system 32-bit data, and outputs it to the output buffer 66. The output buffer 66 re-integrates the restored address and data, and outputs the restored configuration information, i.e., the original configuration information for the logical circuit created by the user, to the reconfigurable device 9 shown in FIG. 1.

As described, the information decompressor 6 shown in FIG. 10 includes: the input buffer 61 operating as a re-separating module which re-separates the compressed difference address and the compressed divided data integrated by the output buffer 46 (compressed configuration information integration/output module) of the information compressor 4 shown in FIG. 7; the address information decompressor (address decompressor) 62 which performs the decompression processing on the compressed difference address re-separated by the input buffer 61 (re-separating module) to restore the uncompressed difference address; and the data information decompressor (data decompressor) 63 which performs the decompression processing on the compressed divided data re-separated by the input buffer 61 (re-separating module) to restore the divided data before being compressed.

The information decompressor 6 further includes: the address adder (address information adder) 64 which adds the current difference address acquired from the address information decompressor 62 and the difference address of right before to restore the original address; the data coupler 65 which couples a plurality of divided data acquired from the data information decompressor 63 to restore the undivided data; and the output buffer 66 operating as the configuration information output module which re-integrates the address acquired from the address adder 64 and the data acquired from the data coupler 65 to restore the original configuration information, and outputs it.

Here, the address information decompressor 62 performs the decompression processing on the compressed difference address that is re-separated by the input buffer 61 (re-separating module) to restore the difference address by referring to the address compression rule 13$a$1 or 13$a$3 used at the time of the address compression processing. Further, the data information decompressor 63 (data decompression module) performs the decompression processing on the compressed divided data that is re-separated by the input buffer 61 (re-separating module) to restore the divided data by referring to the data compression rule 13$a$3 or 13$a$4 used at the time of the data compression processing.

Now, the decompression processing operations of the information decompressor 6 shown in FIG. 10 according to the exemplary embodiment will be described by referring to a flowchart of FIG. 10.

First, the compressed configuration information 15$a$ read out from the compressed configuration information memory 22 of the compression control device 4 shown in FIG. 3 is inputted and stored temporarily (step S201), and it is separated into the compressed difference address and the compressed divided data (step S202). Then, the compressed difference address and the compressed divided data are decompression-processed independently (step S203), and the decompressed difference address and the decompressed divided data are subjected to after-processing independently (step 204).

That is, regarding the decompressed difference address, the current address and the address right before are added to restore the original address. Regarding the decompressed data, the two-system 16-bit divided data are integrated into one-system 32-bit data to be restored into the original data. Then, the after-processed address and data are coupled to be restored into the original configuration information (step S205), and it is outputted to the reconfigurable device 20 (step S206).

(Entire Operation)

Next, entire operations of the information processing system according to the exemplary embodiment will be described.

First, the communication I/F 17 of the compression control device as the configuration information input unit inputs the configuration information 14$a$ containing the addresses and data as a target of information compression (a configuration information inputting step), the information compressor 4 compresses the inputted configuration information 14$a$ (a configuration information compressing step), and the compressed configuration information memory (the compressed configuration information storage module) 15 as the storage module stores the compressed configuration information 15$a$ that is the compressed configuration information as the decompression target information for the user of the configuration information (a compressed configuration information storing step).

When compressing the configuration information 14$a$ (in the configuration information compressing step), first, the input buffer 41 (the information separating module) of the information compressor 4 executes the processing for separating the above-described configuration information 14$a$ into the address information and the data information (a configuration information separating step). Then, the address compressor 44 and the data compressor 45 individually compress the separated address information and data information based on the corresponding compression rules 12$a$1 and 12$a$2 which are individually set in advance (an individual compressing step). Further, the output buffer 46 (the compressed configuration information output module) performs integration processing of the compressed address information and data information, and outputs it as the compressed configuration information 15$a$ (a compressed configuration information outputting step).

Here, prior to execution of the compression processing by the address compressor 44 and the data compressor 45 (the individual compressing step), the compression pre-processing is performed on the address information and the data information as the targets of the compression processing by the corresponding compression pre-processing units 42 and 43, respectively, according to the characteristics thereof (the compression processing pre-step). In that case, the compression pre-processing for the address information (the compression pre-processing step) is executed by the differentiation processing which is executed by the address differentiator 42 as the compression pre-processing section 42 to calculate the difference between the address being processed and the address processed right before. Further, the compression pre-processing for the data information is executed through the data dividing processing executed by the data divider 43 to divide the data information.

Then, the restoring control unit 5 inputs the compressed configuration information 15$a$ outputted from the information compression device 1 described above via the communication I/F 26, and stores it to the compressed configuration information memory (the compressed configuration information storage module) 22.

When decompressing the compressed configuration information 15$a$ stored in the compressed configuration information memory 22 (a decompression processing step), first, the input buffer (the compressed information separating module) 61 executes the processing for separating the compressed configuration information 15$a$ into the compressed address information and the compressed data information (a compressed information separating step), and the address decompressor 62 and the data decompressor 63 separately perform decompression processing on the separated compressed address information and compressed data information based on the corresponding compression rules 13$a$1 (13$a$3) and 13$a$2(13$a$4) which are individually set in advance (an individual decompression processing step).

The output buffer 66 (the compressed configuration information output module) re-integrates the individually decompressed address information and data information, and outputs re-integrated information as the configuration information 14a (a configuration information integrating/outputting step). The configuration information 14a outputted from the output buffer 66 is transmitted to the reconfigurable device 9 shown in FIG. 1.

Here, right after the decompression processing of each of the information executed by the address decompressor 62 and the data decompressor 63 described above, the decompressed information after-processing units 64 and 65 execute the after-processing on the decompressed address information and the decompressed data information, respectively, by corresponding to the characteristics thereof for regeneration of the configuration information (a decompressed information after-processing step).

The after-processing of the decompressed data for the decompressed address information described above is executed by a form of address adding processing that is a calculation executed by the address adder to acquire the sum of the currently-processed address and the address processed right before by taking the decompressed addresses as the targets. The decompressed data after-processing for the decompressed data information is specifically executed by a form of data coupling processing that is executed by the data coupler 65 to couple the data information divided by the data divider 43 (integrates the two pieces of 16-bit data into 32-bit data).

Next, a series of flow (operations) of the compression processing and the decompression processing will be described by employing specific numerical values of addresses and data as examples.

Figure 12:
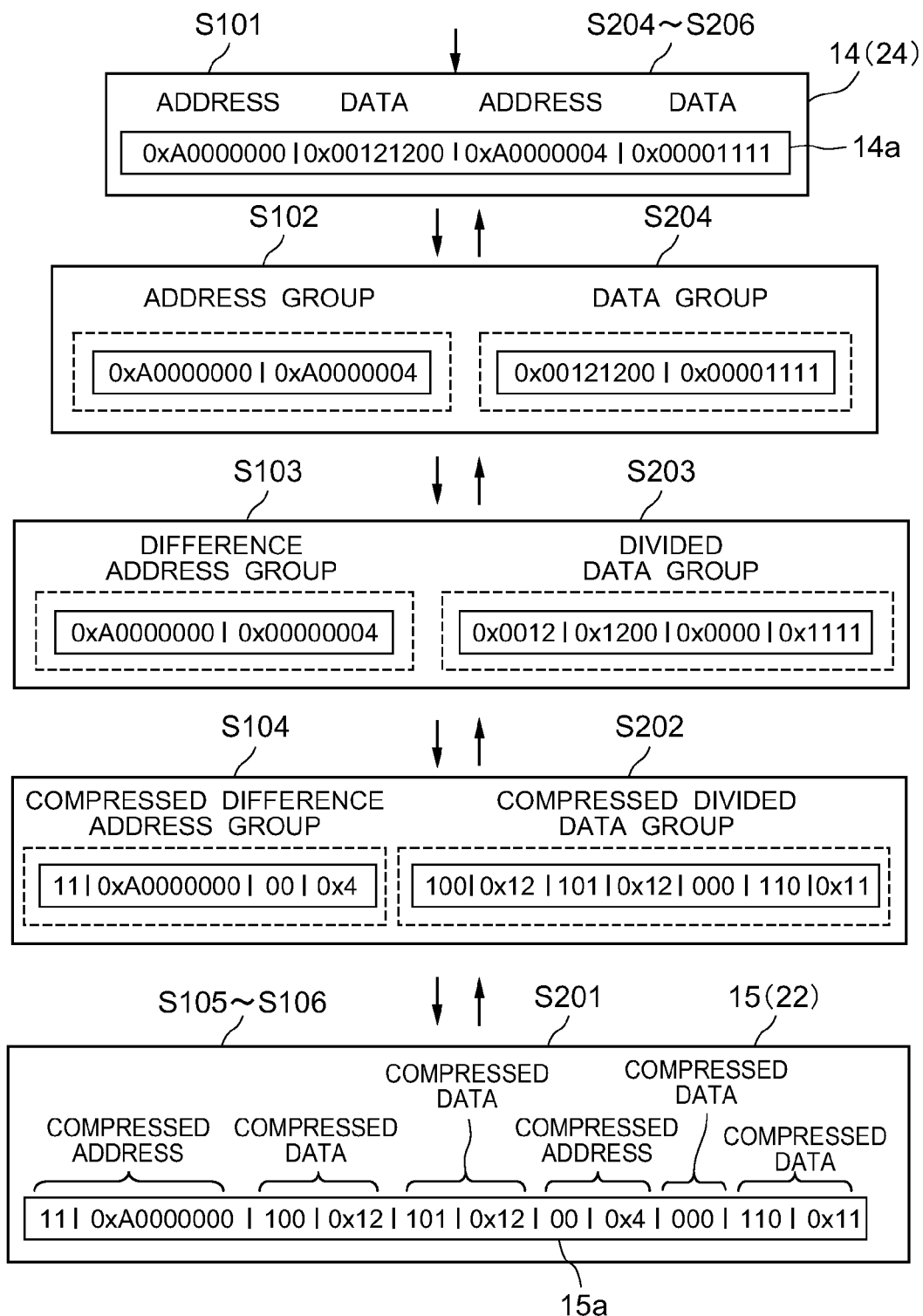
FIG. 12 is an explanatory illustration of an operation state showing a series of flows of the compression processing and the decompression processing of a case where an address compression rule and a data compression rule shown in FIG. 5 are referred.

FIG. 12 is an illustration showing a series of flow of the compression processing and the decompression processing in a case of referring to the address compression rule 13a1 and the data compression rule 13a2 shown in FIG. 5.

Figure 8:
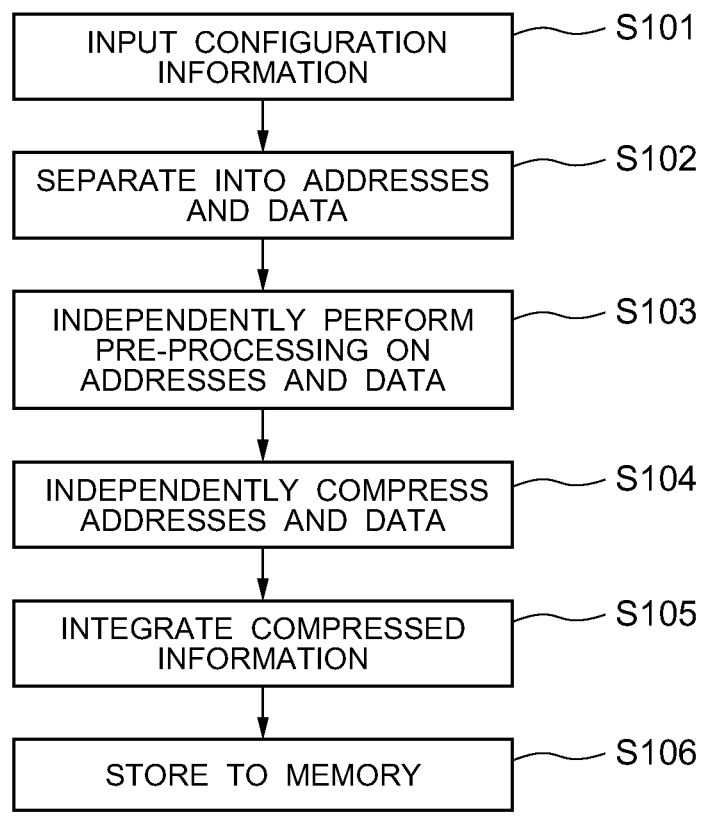
FIG. 8 is a flowchart showing operations of compression processing executed by the information compression device shown in FIG. 1.

In FIG. 12, reference numerals S101 to S104 correspond to the processing under same reference numerals of the flowchart of the compression processing shown in FIG. 8. Similarly, reference numerals S201 to S204 in FIG. 12 correspond to the processing under same reference numerals of the flowchart of the decompression processing shown in FIG. 11.

In FIG. 12, the configuration information inputted by the user to the information compression device 1 shown in FIG. 1, i.e., the uncompressed configuration information 14a is constituted with an address "0xA0000000", data "0x00121200" corresponding to this address, an address "0xA0000004", data "0x00001111" corresponding to this address (and so forth) (step S101). Note here that the address and data are not necessarily in a pair on one on one basis. A plurality of data may correspond to a single address.

In the case of compression processing, the configuration information 14a is separated into an address group and a data group (step S101). Therefore, as shown in FIG. 12, the address group after being processed in step S101 is constituted with a head address "0xA0000000", a second address "0xA0000004", and addresses thereafter omitted herein. Further, the data group after being processed in step S101 is constituted with a head data "0x00121200", a second data "0x00001111", and data thereafter omitted herein.

Difference pre-processing is performed on the address group to generate a difference address group (step S102). A head difference address is "0xA0000000", and a second difference address is "0x00000004" which is a value acquired by subtracting "0xA0000000" that is the address right before from the current address "0xA0000004". In general, the address information has relatively continued values that are different from each other, so that compression thereof is difficult in that state. Therefore, through employing an arithmetic operation of subtracting the address right before from the current address as pre-processing, a great number of information having same value can be extracted. Thus, the compression rate can be improved greatly by the compression processing executed thereafter.

In the meantime, pre-processing of dividing the data from 32-bit data into 16-bit data is executed on the data group to generate a divided data group (step S103). Thus, the divided data group is constituted with data of 16-bit each, i.e., "0x0012", "0x1200", "0x0000", "0x1111".

In general, the data information is setting information of the reconfigurable device 9 having a repeated configuration, so that it is in many cases constituted with small values having the small number of bits as a minimum unit. Therefore, through employing processing of dividing into 16-bit data as pre-processing, a great number of information having same address difference can be extracted. Thus, the compression rate can be improved greatly by the compression processing executed thereafter.

As described, with this exemplary embodiment, the addresses and the data having different characteristics are separated and the pre-processing as well as the compression processing thereafter is individually executed in the manner described above. This makes it possible to greatly improve the compression rate as a whole. Further, as a result, the capacity of the compressed configuration information memory 22 for storing the compressed configuration information 15a can be suppressed, so that the product cost can be decreased.

Compression processing is performed on the difference address group which has undergone the processing of step S102 to generate a compressed difference address group (step S103). A head difference address "0xA0000000" is in a 32-bit configuration with no code extension, so that it corresponds to a code "11" of the address compression rule 13a1 of FIG. 5. Thus, the head compressed difference address becomes the code "11" and 32-bit data "0xA0000000". A second difference address "0x00000004" is in a 4-bit configuration with no code extension, so that it corresponds to a code "00" of the address compression rule 13a1. Thus, the second compressed difference address becomes the code "00" and 4-bit data "0x4".

Compression processing is performed on the divided data group that has undergone the processing of step S102 to generate the compressed data group (step S103). The four pieces of divided data that are divided into 16-bit each, i.e., "0x0012", "0x1200", "0x0000", "0x1111", correspond to 16-bit data of no code extension corresponding to a code "100", zero-padded 16-bit data corresponding to a code "101", all-zero 16-bit data corresponding to "000", and data of same higher-order and lower-order bytes corresponding to a code "110", respectively, by referring to the compressed data rule 13a2 of FIG. 5. Thus, the compressed divided data group is constituted with the code "100" and "0x12", the code "101" and "0x12", only the code "000", and the code "110" and "0x11".

The compressed difference address group and the compressed divided data group after undergoing the processing of step S103 are integrated to generate the compressed configuration information 15a (step S105). The generated compressed configuration information 15a after undergoing the processing of step S104 is formed with a plurality of sets of information by having a single compressed address and two pieces of compressed data following that address as a set. The generated compressed configuration information 15a is stored in the compressed configuration information memory 15 shown in FIG. 2 and, thereafter, transmitted to the information restoring device 2 via the communication line L shown in FIG. 1. The information restoring device 2 stores the received compressed configuration information 15*a* to the compressed configuration information memory 22 collectively.

For the decompression processing, the processing of step S201 to step S204 is executed in the direction inverted from the compression processing that is performed on the compressed configuration information 15*a* in FIG. 12 to restore the original configuration information 14*a*. The restored configuration information 14*a* is supplied to the reconfigurable device 9 shown in FIG. 1.

Note here that a series of associated operations of the execution contents in each step including the operations of each of the above-described structural members may be put into a program to have it executed by a computer provided to the compression control device 1 or the information restoring device 2.

(Effects of Exemplary Embodiment)

The exemplary embodiment is structured to separate the address information and the data information, respectively, to perform the compression processing individually, and to perform the integration processing when performing transmission or storing processing of the information containing the addresses and data having different characteristics from each other. Thus, it becomes possible to achieve a high compression rate of the addresses and the data. Further, the compression standard is prepared individually for the addresses and data, so that it is unnecessary to provide a character string dictionary of a large memory capacity in which the both are integrated. Furthermore, as described above, the information restoring device is structured to be able to execute the inverted-order procedure by corresponding to the information compression device. Therefore, it is possible to perform decompression/restoration of the compressed information promptly and smoothly.

(Another Exemplary Embodiment (1))

Figure 13:
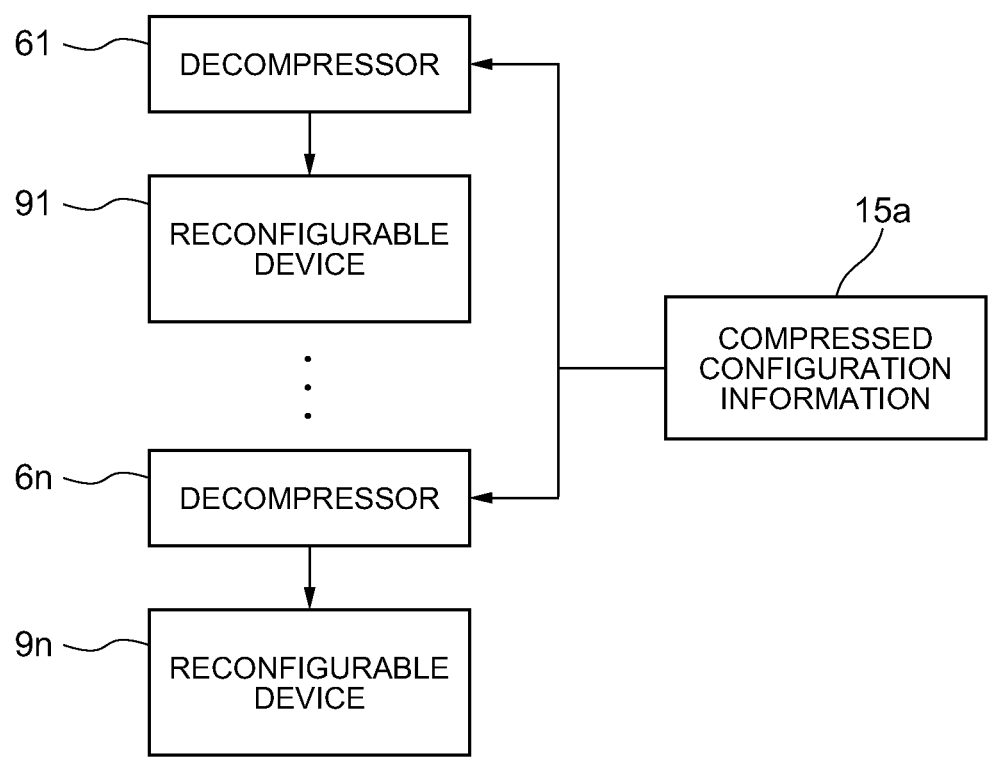
FIG. 13 is a block diagram showing the structure of decompression/restoration processing according to another exemplary embodiment (1) of the invention.

FIG. 13 shows the structure of decompression processing according to another exemplary embodiment (1) of the present invention.

With this exemplary embodiment shown in FIG. 13, generation of logic circuits for a plurality of reconfigurable devices and evaluations thereof after generating the logic circuits are executed in parallel. In FIG. 13, information decompressors 61 to 6*n* are connected by corresponding to each of a plurality of reconfigurable devices 91 to 9*n*. Compressed configuration information 15*a* is simultaneously supplied to a plurality of information decompressors 61 to 6*n*. Further, each of the information decompressors 61 to 6*n* decompresses the supplied compressed configuration information 15*a*, and supplies it to the corresponding reconfigurable devices 91 to 9*n*.

Other structures are the same as those of the exemplary embodiment shown in FIG. 1 to FIG. 12.

In addition to achieving the same working effects as those of the exemplary embodiment described above, this another exemplary embodiment (1) shown in FIG. 13 allows a plurality of the users to perform works for making products thereafter since generation of logic circuits for a plurality of reconfigurable devices and evaluations thereof after generating the logic circuits are executed in parallel. Further, through performing evaluations of the plurality of reconfigurable devices 91 to 9*n* in parallel, it becomes possible to achieve evaluation of yield, which cannot be done with a single product.

While the compression processing and the decompression processing of the configuration information to be supplied to the logic circuits of the reconfigurable devices 9 (91 to 9*n*) such as FPGA is disclosed in each of the exemplary embodiments, the present invention is not limited only to that. The present invention can be applied to the compression processing and the decompression processing of general information to achieve the information of a high compression rate.

(Another Exemplary Embodiment (2))

Next, another exemplary embodiment (2) according to the exemplary embodiment will be described by referring to FIG. 14.

Figure 14:
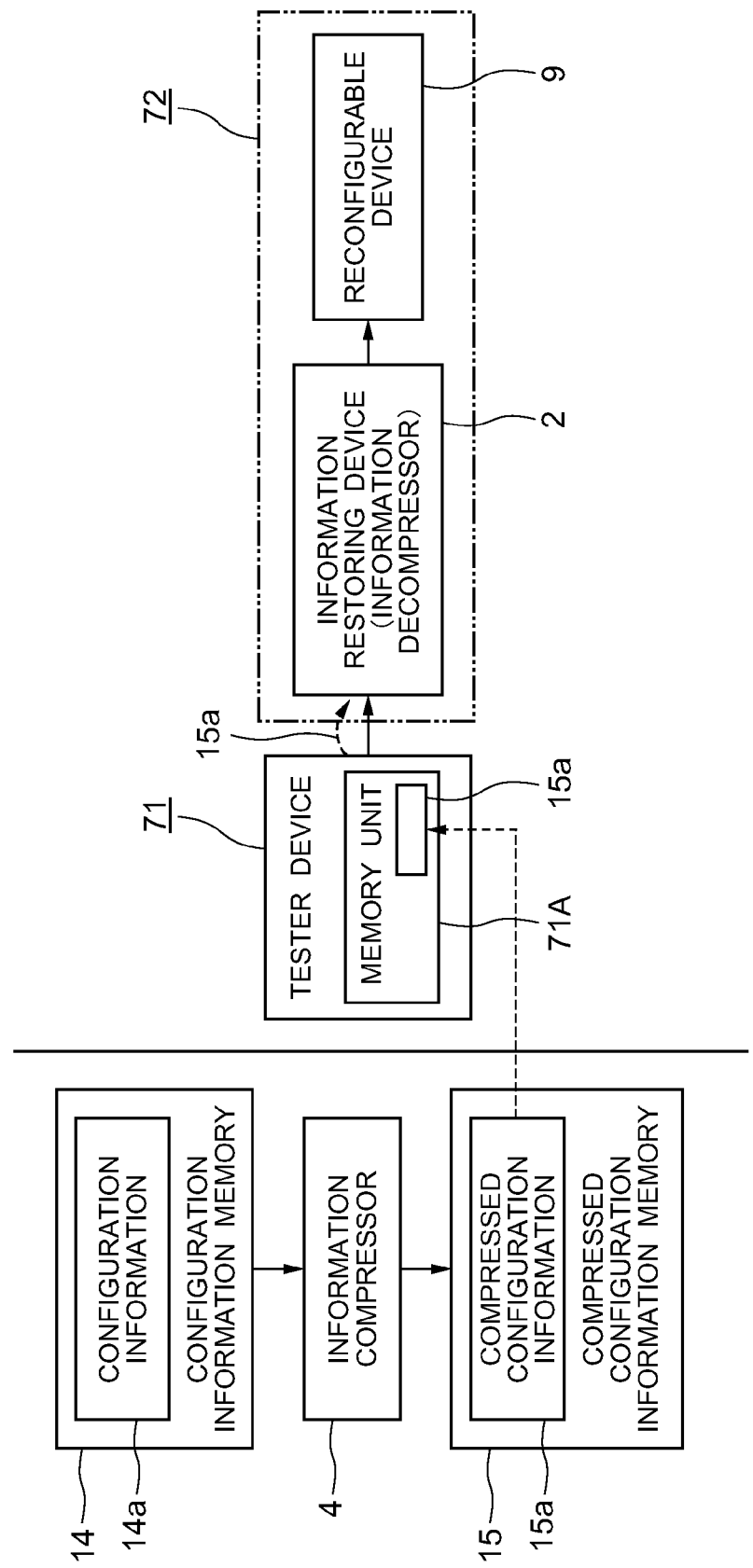
FIG. 14 is a block diagram showing an example of decompression processing of a case where an information restoring device and a reconfigurable device according to another exemplary embodiment (2) of the invention are integrated on a semiconductor chip.

In this another exemplary embodiment (2) shown in FIG. 14, the reconfigurable device 9 and the information restoring device 2 as the information decompressor mounted in the above-described exemplary embodiment shown in FIG. 1 to FIG. 12 are mounted into a semiconductor circuit 72 on a semiconductor chip. A tester device 71 for sending the compressed configuration information 15*a* (for acquiring the configuration information 14*a* containing addresses and data to be used) at the time of executing a test for operation, durability, and the like of the semiconductor circuit 72 is provided along the semiconductor circuit 72. The compressed configuration information 15*a* is stored in a memory unit 71*a* provided to the tester device 71 before executing the test.

Note here that the tester device 71 is structured to fetch the compressed configuration information 15*a* from the compressed configuration information memory 15 in which the compressed configuration information 15*a* that is the configuration information 14*a* compressed by the information compressor 3 is stored, and to store it to the memory unit 71A. Thereafter, the tester device 71 transfers the compressed configuration information 15*a* to the semiconductor device 72 at the time of executing the test of the semiconductor circuit 72. The semiconductor circuit 72 decompresses the transferred compressed configuration information 15*a* by the information decompressor of the information restoring device 2, decompresses and restores the configuration information 14*a* containing the addresses and data, and gives it to the reconfigurable device 9.

Thereby, it becomes possible at the time of executing the test of the semiconductor circuit 72 to send a vast amount of the configuration information 14*a* containing the addresses and data to be used to the reconfigurable device 9 continuously in a short time. That is, at the time of the test of the semiconductor circuit 72, the time for transferring the configuration information 14*a* from the tester device 71 to the semiconductor device 72 can be shortened greatly for the amount of compression. Other structures and working effects are the same as those of the above-described exemplary embodiment shown in FIG. 1 to FIG. 12.

(Another Exemplary Embodiment (3))

Next, another exemplary embodiment (3) according to the present invention will be described by referring to FIG. 15.

Figure 15:
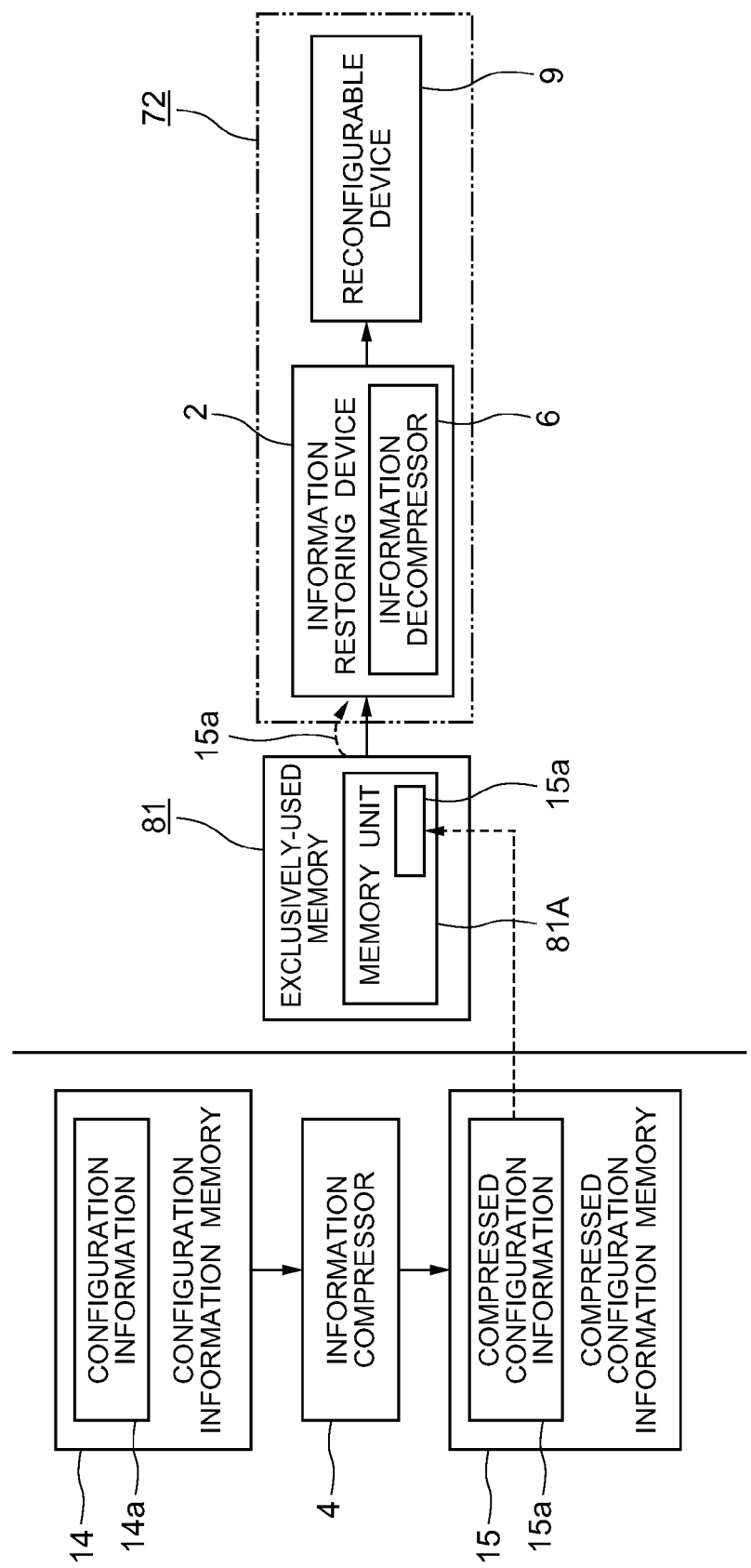
FIG. 15 is a block diagram showing another example of the decompression processing of a case where an information restoring device and a reconfigurable device according to another exemplary embodiment (3) of the invention are integrated on a semiconductor chip.
Figure 16:
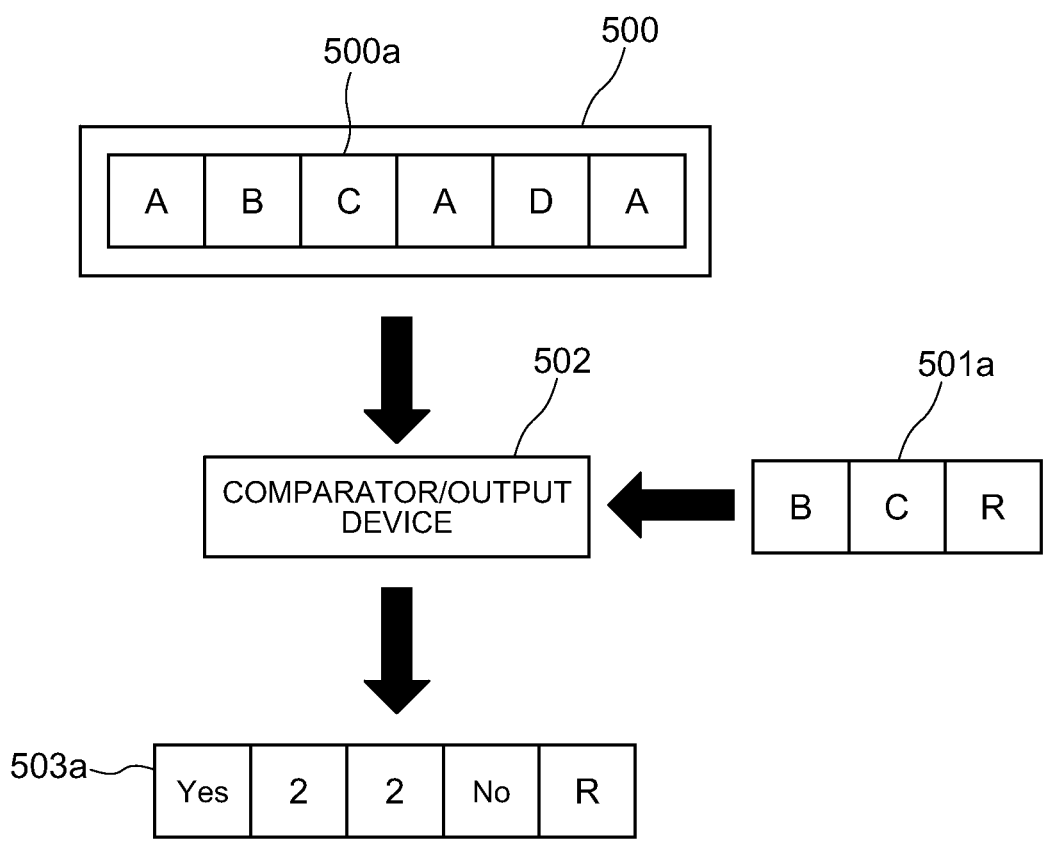
FIG. 16 is an explanatory illustration whish schematically shows a compression method according to a related technique.
Figure 17:
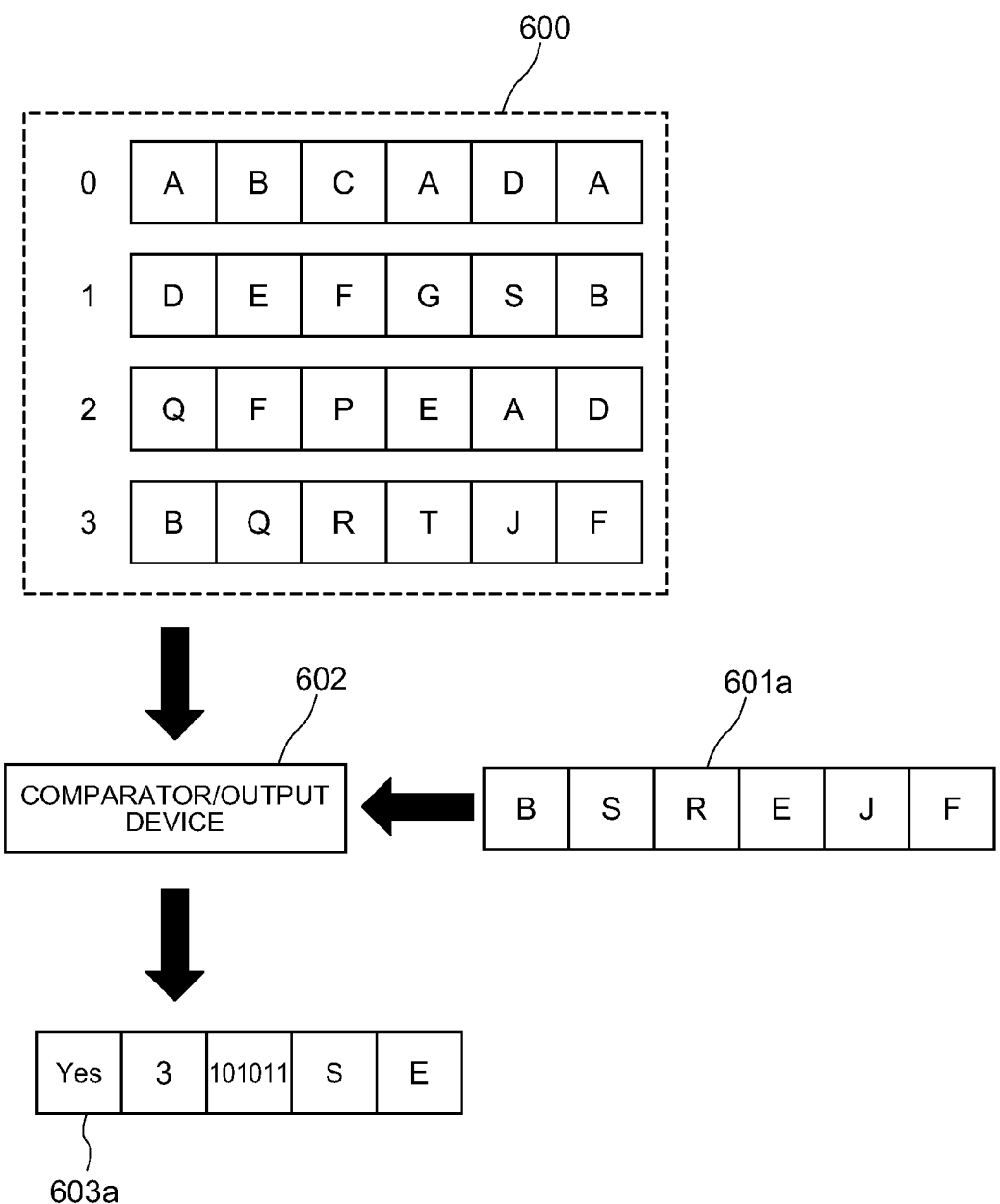
FIG. 17 is an explanatory illustration whish schematically shows another compression method according to a related technique.
Figure 18:
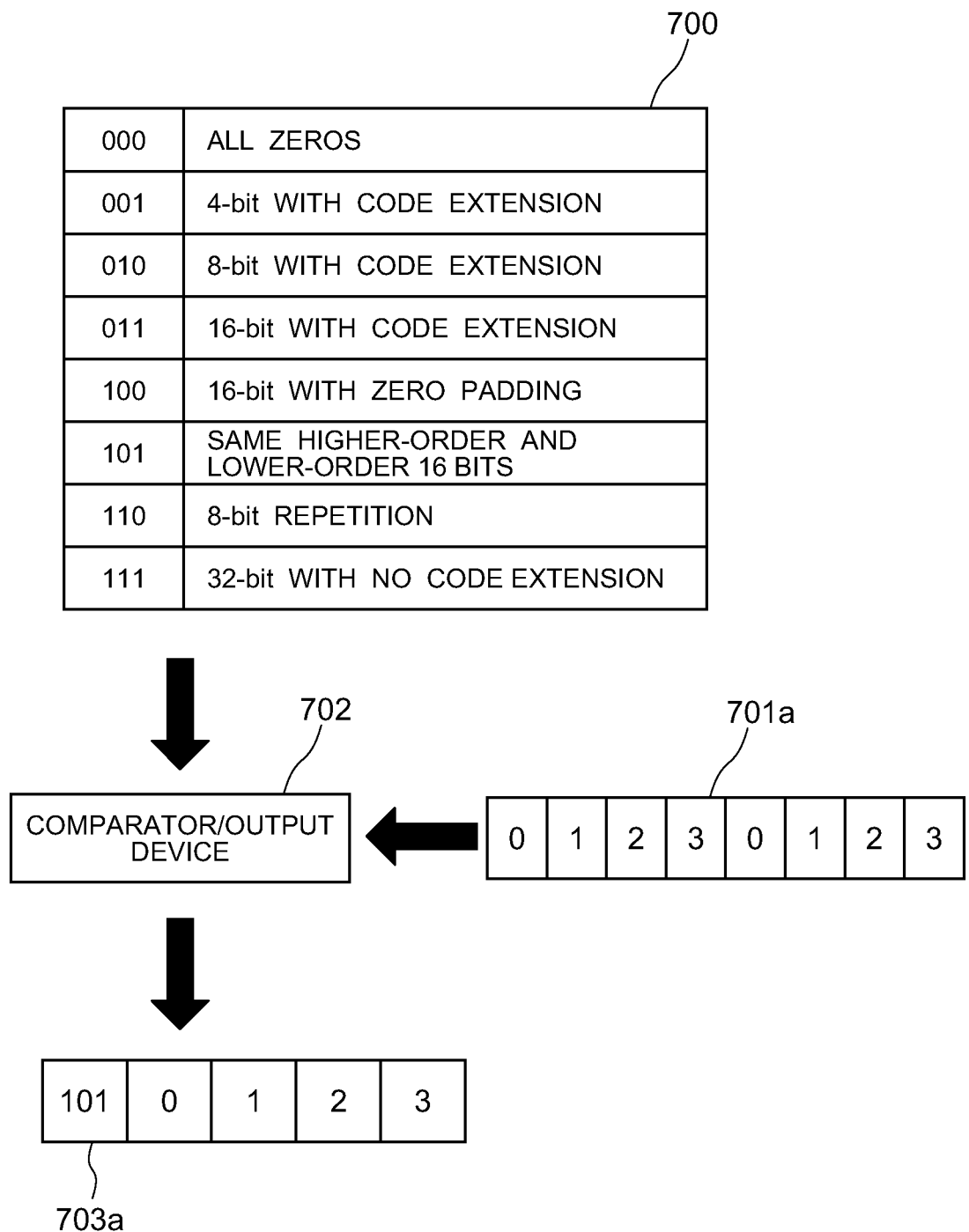
FIG. 18 is an explanatory illustration whish schematically shows still another compression method according to a related technique.

In this another exemplary embodiment (3) shown in FIG. 15, the reconfigurable device 9 and the information restoring device 2 as the information decompressor are mounted into a semiconductor circuit 72 on a semiconductor chip as in the case of another exemplary embodiment (2). An exclusively-used memory 81 for sending the compressed configuration information 15*a* to the reconfigurable device 9 is provided along the semiconductor circuit 72. The compressed configuration information 15*a* is stored in the memory section 71*a* that is provided to the exclusively-used memory 81 by an information transmission system, not shown.

Thereafter, the semiconductor circuit 72 is structured to read out and fetch the compressed configuration information 15a from the memory unit 81A of the exclusively-used memory 81 at the time of the startup. Then, the compressed configuration information 15a fetched to the semiconductor circuit 72 is decompressed by the decompressor of the information restoring device 2 to be restored into the configuration information 14a containing the addresses and the data, and it is given to the reconfigurable device 9.

This makes it possible to send a vast amount of the configuration information 14a containing the addresses and data to be used at the time of the startup of the semiconductor circuit 72 to the reconfigurable device 9 continuously in a short time. That is, at the time of the startup and operation of the semiconductor circuit 72, the time for transferring the configuration information 14a from the exclusively-used memory 81 to the semiconductor device 72 can be shortened greatly for the amount of compression. Other structures and working effects are the same as those of the above-described exemplary embodiment shown in FIG. 1 to FIG. 12.

While the present invention has been described heretofore by referring to the embodiments (and EXAMPLES), the present invention is not limited only to the embodiments (and EXAMPLES). Various changes and modifications occurred to those skilled in the art can be applied to the structures and details of the present invention without departing from the scope of the present invention.

While the case of building the present invention as the hardware structure has been described in the embodiments above, the present invention may also be built on software by causing a CPU to execute a program. In that case, the address differentiator 42, the data divider 43, the address compressor 44, and the data compressor 46 out of the information compressor 4 shown in FIG. 1 are built on software. Further, the address decompressor 62, the data decompressor 63, the address adder 64, and the data coupler 65 out of the information decompressor 6 shown in FIG. 1 are built on software. The programs which build those structures on software are recorded to recording media, and handled as targets of commercial transactions.

This Application claims the Priority right based on Japanese Patent Application No. 2009-083597 filed on Mar. 30, 2009 and the disclosure thereof is hereby incorporated by reference in its entirety.

INDUSTRIAL APPLICABILITY

The present invention can be applied to manufacturing industry for manufacturing reconfigurable devices such as FPGA and CPLD, other semiconductors, electronic apparatuses, and computers, and other related industries.

REFERENCE NUMERALS

1 Information compression device
2 Information restoring device
3 Compression control device
4 Information compressor
5 Restoring control device
6, 61, - - - , 6n Information decompressor
9, 91, - - - , 9n Reconfigurable device
10 Information processing system
13, 23 Compression rule memory
13a Compression rule
13a1, 13a3 Address compression rule
13a2, 13a4 Data compression rule
14, 24 Configuration information memory
14a Configuration information 15, 22 Compressed configuration information memory (compressed information storage module)
15a Compressed configuration information
17, 26 Communication interface (Communication I/F)
41, 61 Input buffer (information separating module)
42 Address differentiator (compression pre-processing unit)
43 Data divider (compression pre-processing unit)
44 Address compressor
45 Data compressor
46 Output buffer (compressed information output module)
61 Input buffer (compressed information separating module)
62 Address decompressor
63 Data decompressor
64 Address adder (decompressed information after-processing unit)
65 Data coupler (decompressed information after-processing unit)
66 Output buffer (configuration information output module)
71 Tester device
72 Semiconductor circuit
81 Exclusively-used memory
L Communication line

The invention claimed is:

1. An information compression device, comprising:
an information compressor which inputs and compresses configuration information containing at least one pair of address information and data information; and
a compression control device that controls operation of the information compressor,
wherein the information compressor includes:
an input buffer which functions to temporarily store and separate the configuration information into a separated address information corresponding to the address information and a separated data information corresponding to the data information;
an address differentiator which inputs the separated address information separated by the input buffer, calculates a difference between a currently-processed first address and a previously processed second address processed right before said first address, and outputs said difference as a calculated difference address;
a data divider which inputs the separated data information separated by the input buffer, divides the separated data information by having sixteen bits as a unit such that the separated data information is to be setting information of a reconfigurable device having a repeated configuration, and outputs divided data;
an address compressor which functions to compress the calculated difference address from the address differentiator for output as compressed address information;
a data compressor which functions to compress the divided data from the data divider for output as compressed data information; and
an output buffer which integrates the compressed address information from the address compressor and the compressed data information output from the data compressor for output as compressed configuration information.

2. The information compression device as claimed in claim 1, wherein the address compressor and the data compressor independently execute compression processing based on respective compression rules that are set in accordance with characteristics of the separated address information and data information.

3. The information compression device as claimed in claim 1, wherein the data divider executes dividing processing on the separated data information by dividing a bit width of data sequences of the data information by a multiple so that the divided data formed of a plurality of repeating values as units of a bit width smaller than the bit width of the data information.

4. The information compression device as claimed in claim 2, wherein the compression rules includes a code indicating a type of compression rule at a head and compressed data accompanying the code.

5. An information processing system, comprising:
an information compression device, including
an information compressor which inputs and compresses configuration information containing at least one pair of address and data as compressed configuration information, and a compression control device which controls operations of the information compressor, and
an information restoring device including an information decompressor which inputs and decompresses the compressed configuration information in which at least one pair of compressed address information and compressed data information is integrated, and a restoring control device which controls the operations of the information decompressor,
wherein:
the information compressor includes
a first input buffer which functions to temporarily store and separate the configuration information into a separated address information corresponding to the address and a separated data information corresponding to the data,
an address differentiator which inputs the separated address information separated by the input buffer, calculates a difference between a currently processed first address and a previously processed second address processed right before said first address, and outputs said difference as a calculated difference address,
a data divider which inputs the separated data information separated by the input buffer, divides the separated data information by having sixteen bits as a unit such that the separated data information is to be setting information of a reconfigurable device having a repeated configuration, and outputs divided data,
an address compressor which functions to compress the calculated difference address differentiated by the address differentiator as compressed data information,
a data compressor which functions to compress the divided data divided by the data divider for output as compressed data information, and
a first output buffer which integrates the compressed data information compressed by the address compressor and the compressed data information compressed by the data compressor for output as the compressed configuration information; and
the decompressor includes
a second input buffer which reads out the compressed configuration information from a compressed configuration information memory which stores the received compressed configuration information and re-separates the compressed configuration information into a separated compressed address and separated compressed data,
an address decompressor which executes decompression processing on the separated compressed address separated by the second input buffer to output difference address information,
a data decompressor which executes decompression processing on the separated compressed data separated by the second input buffer to output divided data,
an address adder which adds a current first difference information acquired from the address information decompressor and a previously acquired second difference information of acquired right before said first difference information to output a restored original address corresponding to the address of said configuration information prior to being compressed,
a data coupler which couples a plurality of said divided data acquired from the data decompressor to output restored undivided data corresponding to the data of said configuration information prior to being compressed, and
an output buffer which integrates the restored original address and the restored undivided data for output as a restored configuration information corresponding to said configuration information prior to being compressed by the information compressor.

6. The information processing system as claimed in claim 5, wherein the address compressor and the data compressor independently execute compression processing based on respective compression rules that are set in accordance with the characteristics of the separated addresses and data.

7. The information processing system as claimed in claim 5, wherein the address decompressor and the data decompressor independently execute decompression processing based on respective compression rules which correspond to the compression rules used by the address compressor and the data compressor for compression.

8. An information processing method, comprising:
for executing compression and decompression with an information processing system that includes i) an information compression device including an information compressor, which inputs and compresses configuration information containing one or more pairs of address and data, ii) a compression control device which controls operations of the information compressor, iii) an information restoring device including an information decompressor which inputs and decompresses compressed configuration information in which at least one pair of compressed address information and compressed data information is integrated, and iv) a restoring control device which controls operations of the information decompressor, wherein execution of the compression and decompression includes the substeps of:
in the information compressor,
temporarily storing and separating each of the one or more pairs of address and data of the inputted configuration information into one or more separated addresses and one or more separated data by way of an input buffer of the information compressor,
for each of the one or more separated addresses, executing differential processing by an address differentiator of the information compressor to produce a differentiated address and, at the same time for each of the one or more separated data, executing dividing processing by a data divider of the information compressor to produce divided data by having sixteen bits as a unit such that each of the data is to be setting information of a reconfigurable device having a repeated configuration, by way of an address compressor of the information compressor, executing first compression processing on each differentiated address and, by way of a data information compressor of the information compressor, executing second compression processing to produce, respectively, a compression-processed address and a compression-processed data, and at an output buffer of the information compressor, integrating the compression-processed address and the compression-processed data to generate the compressed configuration information; and in the information decompressor, reading out the compressed configuration information from a compressed configuration information memory which stores the received compressed configuration information and re-separating the compressed configuration information into one or more separated compressed addresses and one or more separated compressed data by way of an input buffer of the information decompressor, executing decompression processing on each separated compressed address and each separated compressed data by way of, respectively, an address decompressor of the information compressor and a data decompressor of the information compressor to respectively produce a current difference address and divided data, and adding, by way of an address adder of the information decompressor, a current difference address acquired from the address decompressor and a previously acquired difference address to output a restored original address corresponding to address information of said compressed configuration information prior to being compressed in the information compressor;

coupling, by way of a data coupler of the information decompressor the plurality of divided data acquired from the data decompressor to output restored undivided data corresponding to data information of said compressed configuration information prior to being compressed in the information compressor; and integrating, via the output buffer of the information compressor, the restored original address and the restored undivided data as a restored configuration information corresponding to said configuration information prior to being compressed in the information compressor.

9. The information processing method as claimed in claim 8, wherein compression processing is independently executed based on compression rules that are set in advance in accordance with the characteristics of the configuration information.

10. The information processing method as claimed in claim 8, wherein decompression processing is independently executed based on compression rules which correspond to the respective compression rules for compressing the configuration information.

11. A data recording device that has recorded thereon an information compression program comprising executable code that upon execution by a computer device causes the computer device to function as i) an information compressor which inputs and compresses configuration information containing one or more pairs of address and data, and ii) a compression control device which controls operations of the information compressor, the information compression program upon execution by the computer device causes the computer device to execute:

a function which temporarily stores and separates the addresses and the data of the configuration information into, respectively, one or more separated addresses and one or more separated data;

a function which inputs the separated addresses and, for each separated address, calculates a difference between a currently-processed first separated address and a previously processed second separated address processed right before said first separated address, and outputs said difference as calculated difference information;

a function which inputs the separated data, divides the data by having sixteen bits as a unit such that each of the data is to be setting information of a reconfigurable device having a repeated configuration, and outputs divided data;

a function which compresses the calculated difference information for output as compressed address information;

a function which compresses the divided data for output as compressed data information; and a function which integrates the compressed address information and compressed data information for output as the compressed configuration information.

12. The non-transitory recording medium recording the information compression program as claimed in claim 11, the information compression program configured to cause the computer to execute compression processing on the calculated difference information and the divided data based on respective compression rules that are set in advance in accordance with characteristics of the configuration information.

13. An information processing method, comprising:

executing compression using an information compression device that includes i) an information compressor which inputs and compresses configuration information containing at least one pair of address and data and ii) a compression control device which controls operations of the information compressor, wherein execution of the compression includes the sub-steps of:

in an input buffer of the information compressor, for each of said at least one pair of address and data, temporarily storing and separating the address and the data into separated address information and separated data;

inputting the separated address information, calculating a difference between a currently-processed first separated address and a previously processed second address processed right before said first address, and outputting said difference as a calculated difference address information;

inputting the separated data, dividing the data by having sixteen bits as a unit such that each of the data is to be setting information of a reconfigurable device having a repeated configuration, and outputting the divided data;

compressing the calculated difference address information for output as compression-processed address information;

compressing the divided data for output as compression-processed data information; and at an output buffer of the information compressor, integrating the compression-processed address information and the compression-processed data information to generate the compressed configuration information, and storing said compressed configuration information to a compressed configuration information memory of the information compressor.

* * * * *